(12) United States Patent
Jiang et al.

(10) Patent No.: US 11,094,711 B2
(45) Date of Patent: Aug. 17, 2021

(54) MEMORY DEVICE

(71) Applicant: MACRONIX INTERNATIONAL CO., LTD., Hsinchu (TW)

(72) Inventors: Yu-Wei Jiang, Hsinchu (TW); Jia-Rong Chiou, Hsinchu County (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 7 days.

(21) Appl. No.: 16/658,262

(22) Filed: Oct. 21, 2019

(65) Prior Publication Data

US 2021/0118900 A1    Apr. 22, 2021

(51) Int. Cl.
*H01L 27/11582* (2017.01)
*H01L 27/11568* (2017.01)
*H01L 27/11565* (2017.01)

(52) U.S. Cl.
CPC .. *H01L 27/11582* (2013.01); *H01L 27/11565* (2013.01); *H01L 27/11568* (2013.01)

(58) Field of Classification Search
CPC ......... H01L 27/11582; H01L 27/11568; H01L 27/11565; H01L 1127/11519; H01L 27/22556; H01L 27/11529; H01L 27/11524; H01L 27/11563
See application file for complete search history.

(56) References Cited

U.S. PATENT DOCUMENTS

| 2016/0071861 A1* | 3/2016 | Serov | H01L 27/11565 365/185.19 |
| 2016/0086969 A1* | 3/2016 | Zhang | H01L 21/02365 257/314 |
| 2016/0086970 A1* | 3/2016 | Peng | H01L 27/11565 257/324 |
| 2017/0148805 A1* | 5/2017 | Nishikawa | H01L 27/11524 |
| 2018/0019257 A1 | 1/2018 | Son et al. | |

OTHER PUBLICATIONS

TW Office Action dated Jul. 1, 2020 in Taiwan application (No. 108137894).

* cited by examiner

*Primary Examiner* — Galina G Yushina

(74) *Attorney, Agent, or Firm* — McClure, Qualey & Rodack, LLP

(57) ABSTRACT

A memory device includes a channel element, a memory element, and an electrode element. The channel element includes a first channel portion, a second channel portion, and a middle channel portion between the first channel portion and the second channel portion. The first channel portion has a first sidewall channel surface and a second sidewall channel surface opposing to the first sidewall channel surface. The middle channel portion has a third sidewall channel surface and a fourth sidewall channel surface opposing to the third sidewall channel surface. The first sidewall channel surface and the second sidewall channel surface of the first channel portion are outside the third sidewall channel surface and the fourth sidewall channel surface of the middle channel portion respectively. A memory cell is defined in the memory element between the channel element and the electrode element.

19 Claims, 18 Drawing Sheets

MEMORY DEVICE

BACKGROUND

Technical Field

The disclosure relates to a memory device.

Description of the Related Art

As critical dimensions of devices in integrated circuits shrink toward perceived limits of manufacturing technologies, designers have been looking to techniques to achieve greater storage capacity, and to achieve lower costs per bit.

SUMMARY

The present disclosure relates to a memory device.

According to an embodiment, a memory device is provided. The memory device comprises a channel element, a memory element, and an electrode element. The channel element comprises a first channel portion, a second channel portion, and a middle channel portion between the first channel portion and the second channel portion. The first channel portion has a first sidewall channel surface and a second sidewall channel surface opposing to the first sidewall channel surface. The middle channel portion has a third sidewall channel surface and a fourth sidewall channel surface opposing to the third sidewall channel surface. The first sidewall channel surface and the second sidewall channel surface of the first channel portion are outside the third sidewall channel surface and the fourth sidewall channel surface of the middle channel portion respectively. A memory cell is defined in the memory element between the channel element and the electrode element.

According to another embodiment, a memory device is provided. The memory device comprises a channel element, a memory element, and an electrode element. The memory element comprises a first memory portion, a second memory portion, and a middle memory portion between the first memory portion and the second memory portion. The first memory portion has a first outer sidewall memory surface and a second outer sidewall memory surface opposing to the first outer sidewall memory surface. The middle memory portion has a third outer sidewall memory surface and a fourth outer sidewall memory surface opposing to the third outer sidewall memory surface. The first outer sidewall memory surface and the second outer sidewall memory surface of the first memory portion are outside the third outer sidewall memory surface and the fourth outer sidewall memory surface of the middle memory portion respectively. A memory cell is defined in the memory element between the channel element and the electrode element.

According to yet another embodiment, a memory device is provided. The memory device comprises an insulating element, a channel element, a memory element, and an electrode element. An insulating element has a straight strip shape. The channel element surrounds a sidewall surface of the insulating element. A memory cell is defined in the memory element between the channel element and the electrode element.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
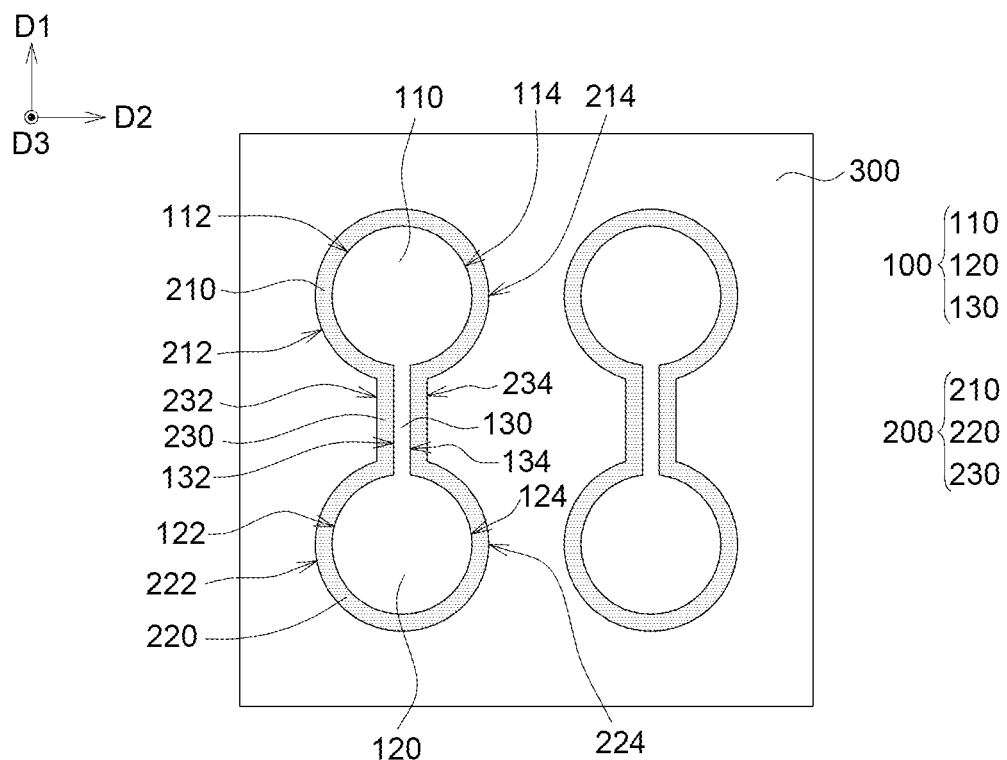
FIG. 1 is a lateral cross-section view of a memory device of an embodiment.

Referring to FIG. 1, a lateral cross-section view of a memory device of an embodiment is shown. The memory device comprises a channel element 100, a memory element 200 and an electrode element 300.

The channel element 100 may have a shape arrangement extending along a first direction D1, and having two opposing end portions extending beyond opposing side surfaces of a middle portion respectively along a second direction D2. The first direction D1 is different from the second direction D2. In an embodiment, the first direction D1 is perpendicular to the second direction D2 substantially. For example, the first direction D1 is the Y direction, and the second direction D2 is the X direction.

Specifically, the channel element 100 may comprise a first channel portion 110, a second channel portion 120, and a middle channel portion 130. The middle channel portion 130 may be between the first channel portion 110 and the second channel portion 120. The first channel portion 110 has a sidewall surface comprising a first sidewall channel surface 112 and a second sidewall channel surface 114 opposing to the first sidewall channel surface 112. The middle channel portion 130 has a third sidewall channel surface 132 and a fourth sidewall channel surface 134 opposing to the third sidewall channel surface 132. The second channel portion 120 has a sidewall surface comprising a fifth sidewall channel surface 122 and a sixth sidewall channel surface 124 opposing to the fifth sidewall channel surface 122. The first sidewall channel surface 112, the third sidewall channel surface 132 and the fifth sidewall channel surface 122 are on the same one side of the channel element 100. The second sidewall channel surface 114, the fourth sidewall channel surface 134 and the sixth sidewall channel surface 124 are on the same another side of the channel element 100. The third sidewall channel surface 132 may be between the first sidewall channel surface 112 and the fifth sidewall channel surface 122. The fourth sidewall channel surface 134 may be between the second sidewall channel surface 114 and the sixth sidewall channel surface 124. The first sidewall channel surface 112 and the second sidewall channel surface 114 of the first channel portion 110 are outside the third sidewall channel surface 132 and the fourth sidewall channel surface 134 of the middle channel portion 130 respectively in the second direction D2. The fifth sidewall channel surface 122 and the sixth sidewall channel surface 124 of the second channel portion 120 are outside the third sidewall channel surface 132 and the fourth sidewall channel surface 134 of the middle channel portion 130 respectively in the second direction D2.

The middle channel portion 130 may have a straight strip shape extending along the first direction D1. The third sidewall channel surface 132 and the fourth sidewall channel surface 134 of the middle channel portion 130 may have a plane shape extending along the first direction D1. The first channel portion 110 may have a segment shape, having a sidewall surface having an open ring shape. The first sidewall channel surface 112 and the second sidewall channel surface 114 of the sidewall surface of the first channel portion 110 have open ring shapes opposing to each other. The second channel portion 120 may have a segment shape, having a sidewall surface having an open ring shape. The fifth sidewall channel surface 122 and the sixth sidewall channel surface 124 of the sidewall surface of the second channel portion 120 have open ring shapes opposing to each other.

In an embodiment, the channel element 100 may have a dumbbell shape arrangement as shown in FIG. 1. In detail, the first channel portion 110 may have a major segment shape, having a sidewall surface having a major arc shape bigger than 180 degrees. The first sidewall channel surface 112 and the second sidewall channel surface 114 of the sidewall surface of the first channel portion 110 have minor arc shapes smaller than 180 degrees, and have curving directions opposing to each other. The second channel portion 120 may have a major segment shape, having a sidewall surface having a major arc shape bigger than 180 degrees. The fifth sidewall channel surface 122 and the sixth sidewall channel surface 124 of the sidewall surface of the second channel portion 120 have minor arc shapes smaller than 180 degrees, and curving directions opposing to each other. The plane third sidewall channel surface 132 of the middle channel portion 130 may be adjoined between the first sidewall channel surface 112 and the fifth sidewall channel surface 122. The plane fourth sidewall channel surface 134 of the middle channel portion 130 may be adjoined between the second sidewall channel surface 114 and the sixth sidewall channel surface 124. The first channel portion 110 and the second channel portion 120 may be arranged symmetrically with the middle channel portion 130 as a center.

The memory element 200 may surround on the sidewall surface of the channel element 100, and may have a close ring shape. The memory element 200 may have an inner sidewall surface adjoining with the channel element 100. The memory element 200 comprises a first memory portion 210, a second memory portion 220, and a middle memory portion 230. The middle memory portion 230 is between the first memory portion 210 and the second memory portion 220. The first memory portion 210 has an outer sidewall surface comprising a first outer sidewall memory surface 212 and a second outer sidewall memory surface 214 opposing to the first outer sidewall memory surface 212. The middle memory portion 230 has an outer sidewall surface comprising a third outer sidewall memory surface 232 and a fourth outer sidewall memory surface 234 opposing to the third outer sidewall memory surface 232. The second memory portion 220 has an outer sidewall surface comprising a fifth outer sidewall memory surface 222 and a sixth outer sidewall memory surface 224 opposing to the fifth outer sidewall memory surface 222. The first outer sidewall memory surface 212, the third outer sidewall memory surface 232 and the fifth outer sidewall memory surface 222 of the outer sidewall surface of the memory element 200 are on the same one side of the memory element 200. The second outer sidewall memory surface 214, the fourth outer sidewall memory surface 234 and the sixth outer sidewall memory surface 224 of the outer sidewall surface of the memory element 200 are on the same another side of the memory element 200. The third outer sidewall memory surface 232 may be between the first outer sidewall memory surface 212 and the fifth outer sidewall memory surface 222. The fourth outer sidewall memory surface 234 may be between the second outer sidewall memory surface 214 and the sixth outer sidewall memory surface 224. The first outer sidewall memory surface 212 and the second outer sidewall memory surface 214 of the first memory portion 210 are outside the third outer sidewall memory surface 232 and the fourth outer sidewall memory surface 234 of the middle memory portion 230 respectively in the second direction D2. The fifth outer sidewall memory surface 222 and the sixth outer sidewall memory surface 224 of the second memory portion 220 are outside the third outer sidewall memory surface 232 and the fourth outer sidewall memory surface 234 of the middle memory portion 230 respectively in the second direction D2.

The middle memory portion 230 may have straight strip shape extending along the first direction D1. The middle memory portion 230, the third outer sidewall memory surface 232, the fourth outer sidewall memory surface 234 and an inner sidewall memory surface of the middle memory portion 230 may have a plane shape extending along the first direction D1. The first memory portion 210 may have an open ring shape, having a sidewall surface (comprising the first outer sidewall memory surface 212, the second outer sidewall memory surface 214, and the inner sidewall memory surface) also having an open ring shape. The second memory portion 220 may have an open ring shape, having a sidewall surface (comprising the fifth outer sidewall memory surface 222, the sixth outer sidewall memory surface 224, and the inner sidewall memory surface) also having an open ring shape.

In an embodiment, the memory element 200 may have a close ring shape, or a hollow dumbbell shape arrangement as shown in FIG. 1. In detail, the first memory portion 210 and the second memory portion 220 may have major arc shapes, and have curving directions opposing to each other. The two straight strips of the middle memory portion 230 may be adjoined between the first memory portion 210 and the second memory portion 220. The first memory portion 210 and the second memory portion 220 may be disposed symmetrically with the middle memory portion 230 as a center. The memory element 200 may have a uniform thickness. The electrode element 300 may surround on the outer sidewall surface of the memory element 200.

In embodiments, a memory cell is defined in the memory element 200 between the channel element 100 and the electrode element 300. The first channel portion 110 may be electrically connected to one of a source electrode and a drain electrode, and the second channel portion 120 may be electrically connected to the other of the source electrode and the drain electrode. Otherwise, the first channel portion 110 may be functioned as one of a channel source and a channel drain, and the second channel portion 120 may be functioned as the other of the channel source and the channel drain. The electrode element 300 may be functioned as a word line.

Figure 17A:
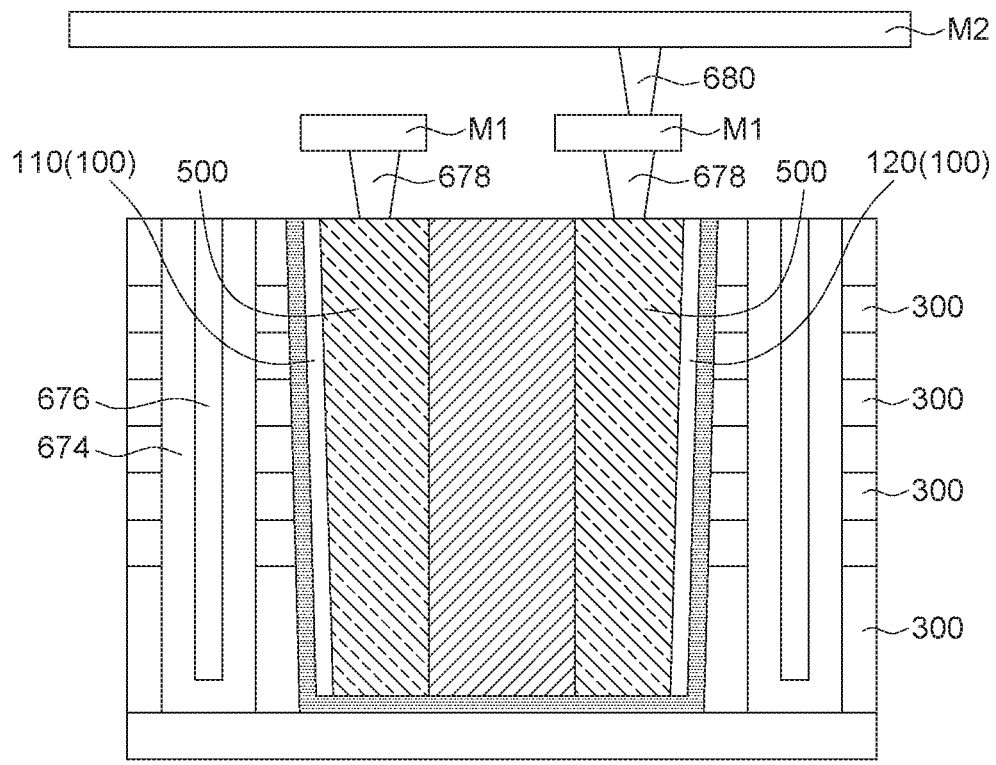
Figure 17B:
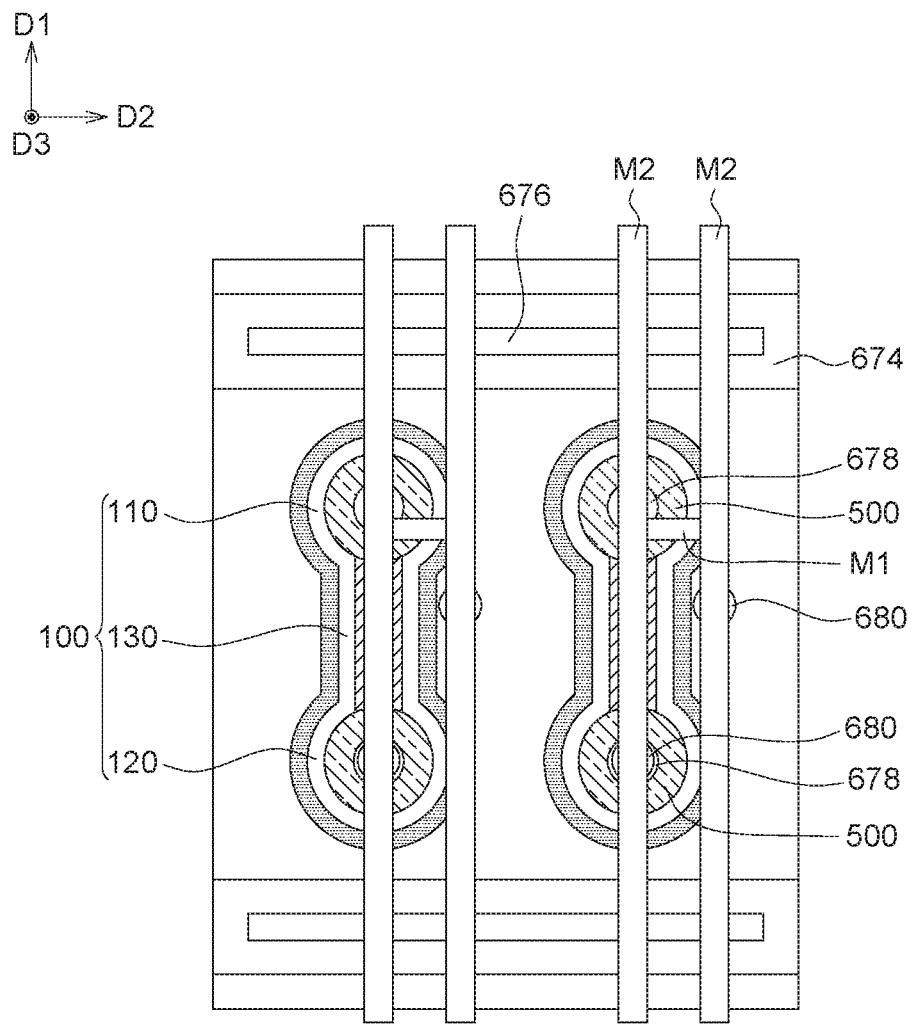

As shown in FIG. 1, the channel element 100 and the memory element 200 as a whole may have a solid dumbbell shape. This memory component according to embodiments can have a decreased unit size. Therefore, a memory cell array density of the memory device can be increased. The first channel portion 110 and the second channel portion 120 have an area/size larger than an area/size of the middle channel portion 130. Therefore, an alignment of a manufacturing step for forming an upper conductive element (such as a first conductive via 678 as shown in FIG. 17A and FIG. 17B) and a condition of electrical connection between the first channel portion 110/second channel portion 120 and the upper conductive element can be improved. Process window and product yield are increased.

Figure 2:
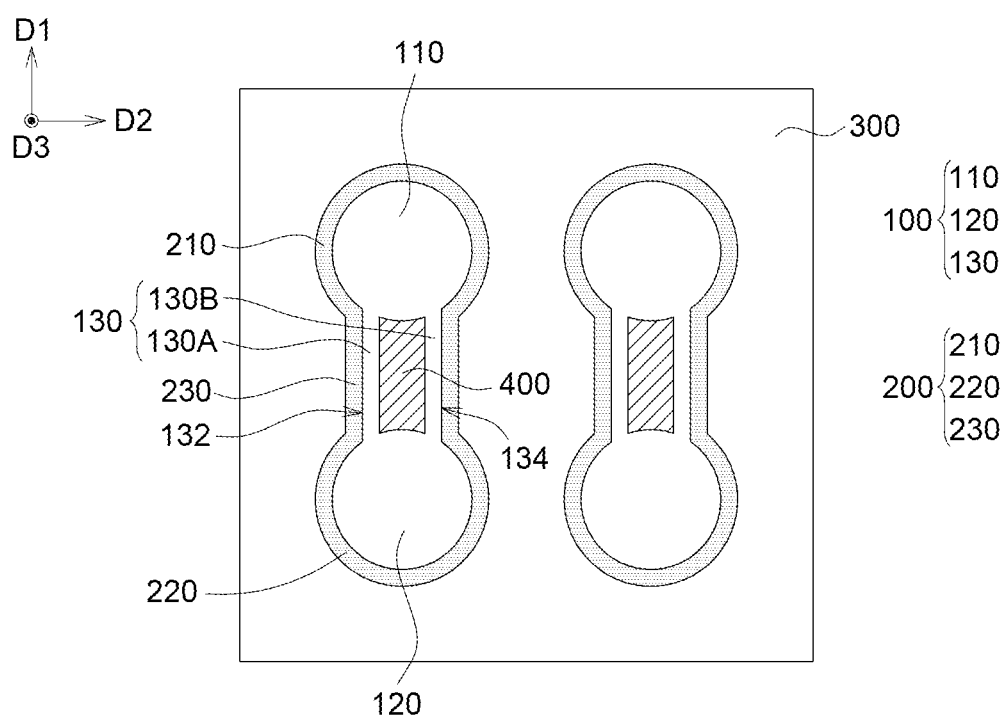
FIG. 2 is a lateral cross-section view of a memory device of another embodiment.

Referring to FIG. 2, a lateral cross-section view of the memory device of another embodiment is shown. The difference of the memory device in FIG. 2 and the memory device in FIG. 1 is described as the following. The memory device further comprises an insulating element 400. The middle channel portion 130 of the channel element 100 comprises a first middle channel portion 130A and a second middle channel portion 130B separated from the first middle channel portion 130A by the insulating element 400. The insulating element 400 may have a straight strip shape extending along the first direction D1. The channel element 100 surrounds a sidewall surface of the insulating element 400. In this embodiment, the first middle channel portion 130A has the third sidewall channel surface 132. The second middle channel portion 130 has the fourth sidewall channel surface 134. The middle channel portion 130 may have an inner sidewall channel surface adjoined with the insulating element 400.

As show in FIG. 2, the insulating element 400 and the channel element 100 as a whole may have a solid dumbbell shape. The insulating element 400, the channel element 100 and the memory element 200 as a whole may have a solid dumbbell shape. This memory component according to embodiments can have a decreased unit size. Therefore, a memory cell array density of the memory device can be increased. The first channel portion 110 and the second channel portion 120 have an area/size larger than an area/size of the middle channel portion 130. Therefore, an alignment of a manufacturing step for forming an upper conductive element (such as the first conductive via 678 as shown in FIG. 17A and FIG. 17B) and a condition of electrical connection between the first channel portion 110/second channel portion 120 and the upper conductive element can be improved. Process window and product yield are increased.

Figure 3:
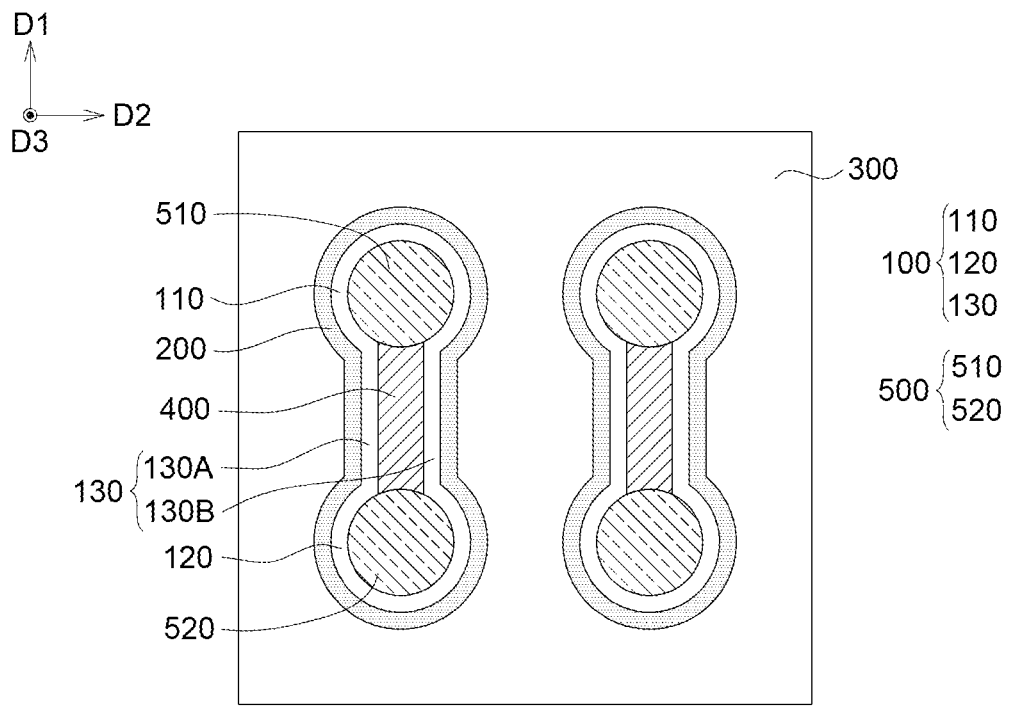
FIG. 3 is a lateral cross-section view of a memory device of yet another embodiment.

Referring to FIG. 3, a lateral cross-section view of the memory device of yet another embodiment is shown. The difference of the memory device in FIG. 3 and the memory device in FIG. 2 is described as the following. The memory device further comprises a pillar element 500. The pillar element 500 comprises a first pillar element 510 and a second pillar element 520. The first channel portion 110 of the channel element 100 may have a ring shape, having an inner sidewall channel surface having a close ring shape and surrounding a sidewall surface of the first pillar element 510. The second channel portion 120 of the channel element 100 may have a ring shape, having an inner sidewall channel surface having a close ring shape and surrounding a sidewall surface of the second pillar element 520. In embodiments, the pillar element 500 has a conductivity larger than or substantially equal to a conductivity of the channel element 100. In embodiments, the pillar element 500 may comprise a channel material identical to or different from a channel material of the channel element 100, such as an un-doped or doped semiconductor material, such as a N type/P type polysilicon and so on, and the pillar element 500 may be regarded as a part of the channel element 100. In another embodiment, the pillar element 500 may comprise an electrode material (such as a metal or a heavily doped semiconductor material such as a heavily doped N type/P type polysilicon and so on), wherein the first pillar element 510 on the side of the first channel portion 110 may be functioned as one of a source or a drain, and the second pillar element 520 on the side of the second channel portion 120 may be functioned as the other of the source or the drain.

As shown in FIG. 3, the insulating element 400, the channel element 100 and the pillar element 500 as a whole may have a solid dumbbell shape. The insulating element 400, the channel element 100, the memory element 200, and the pillar element 500 as a whole may have a solid dumbbell shape. This memory component according to embodiments can have a decreased unit size. Therefore, a memory cell array density of the memory device can be increased. The first channel portion 110 and the first pillar element 510 as a whole, and the second channel portion 120 and the second pillar element 520 as a whole have an area/size larger than an area/size of the middle channel portion 130. Therefore, an alignment of a manufacturing step for forming an upper conductive element (such as the first conductive via 678 as shown in FIG. 17A and FIG. 17B) and a condition of electrical connection between the first channel portion 110/second channel portion 120 and the upper conductive element can be improved. Process window and product yield are increased.

Figure 4:
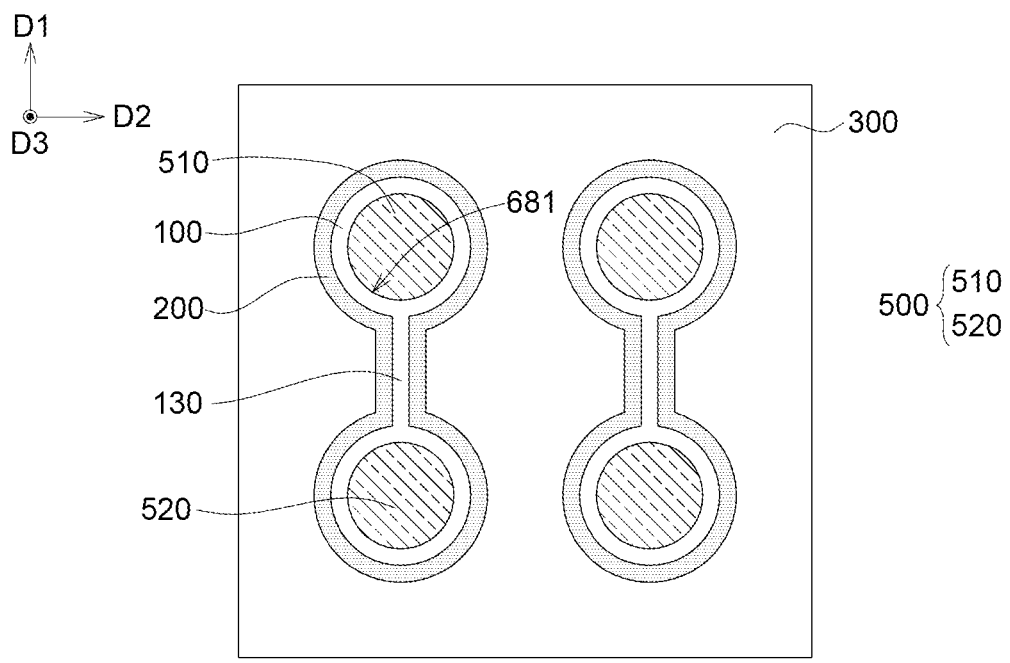
FIG. 4 is a lateral cross-section view of a memory device of even yet another embodiment.

Referring to FIG. 4, a lateral cross-section view of the memory device of even yet another embodiment is shown. The difference of the memory device in FIG. 4 and the memory device in FIG. 1 is described as the following. The memory device further comprises the pillar element 500.

As shown in FIG. 4, the channel element 100 and the pillar element 500 as a whole may have a solid dumbbell shape. The channel element 100, the memory element 200, and the pillar element 500 as a whole may have a solid dumbbell shape. This memory component according to embodiments can have a decreased unit size. Therefore, a memory cell array density of the memory device can be increased. The first channel portion 110 and the first pillar element 510 as a whole, and the second channel portion 120 and the second pillar element 520 as a whole have an area/size larger than an area/size of the middle channel portion 130. Therefore, an alignment of a manufacturing step for forming an upper conductive element (such as the first conductive via 678 as shown in FIG. 17A and FIG. 17B) and a condition of electrical connection between the first channel portion 110/second channel portion 120 and the upper conductive element can be improved. Process window and product yield are increased.

FIG. 5A to FIG. 17B are used to illustrate a method for manufacturing the memory device according to embodiments.

Figure 5A:
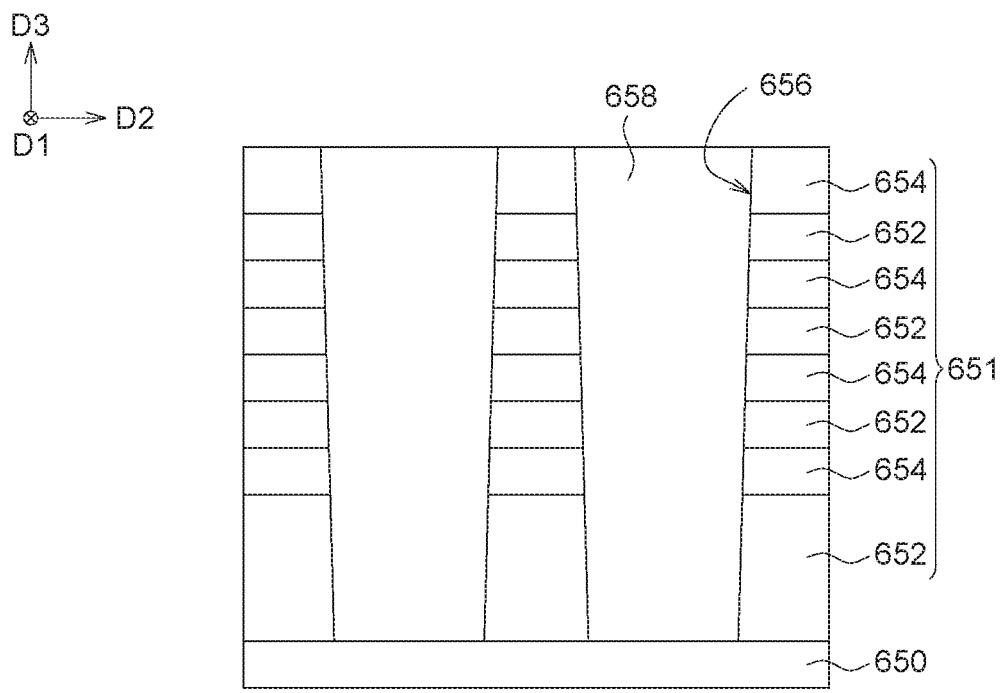
FIG. 5A to FIG. 17B illustrate a method for manufacturing a memory device according to embodiments.
Figure 5B:
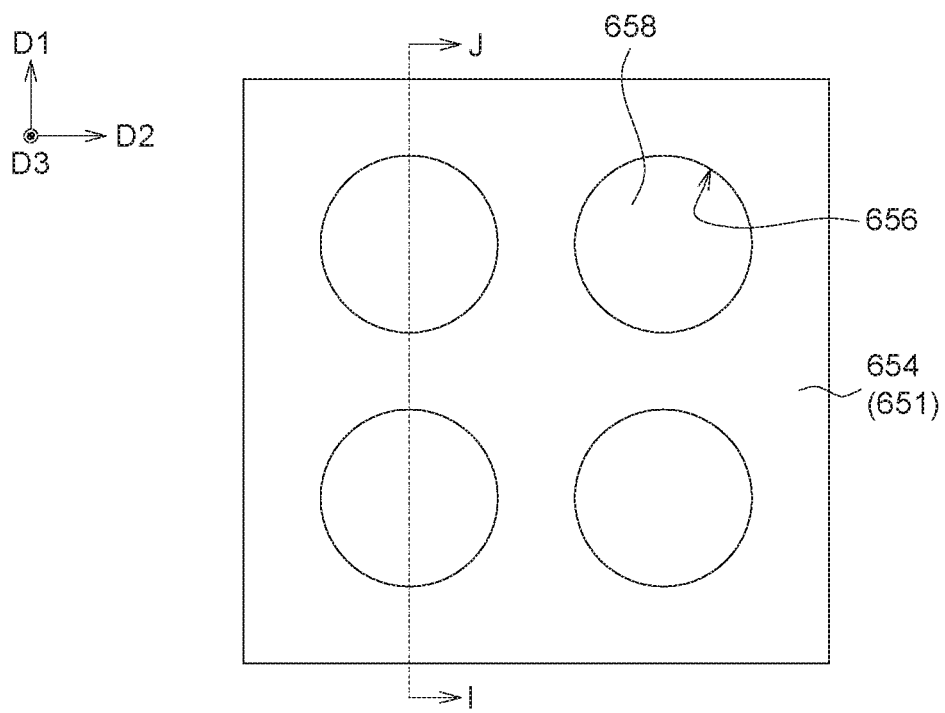

FIG. 5A and FIG. 5B are referred to. FIG. 5A is a longitudinal cross-section view of the memory device, which may be drawn along a I-J line shown in FIG. 5B. FIG. 5B is a top view of the memory device. A stacked structure 651 may be formed on a substrate 650. The stacked structure 651 comprises material layers 652 and insulating layers 654 stacked alternately on the substrate 650. The material layer 652 has a material different from a material of the insulating layer 654. In an embodiment, the material layer 652 comprises a nitride such as silicon nitride. The insulating layer 654 comprises an oxide such as silicon oxide. However, the present disclosure is not limited thereto. The insulating layer 654 may use other suitable insulating materials. The material layer 652 may use other suitable materials such as a dielectric material or a conductive material. An opening 656 may be formed in the stacked structure 651 by using a photolithography etching technique, and then a material pillar 658 may be formed to fill the opening 656. In an embodiment, the material pillar 658 may comprise an oxide. For example, the material pillar 658 may comprise silicon oxide formed by using a low-temperature oxidation process. However, the present disclosure is not limited thereto. The material pillar 658 may use other suitable materials, such as an organic dielectric material and so on.

Figure 6A:
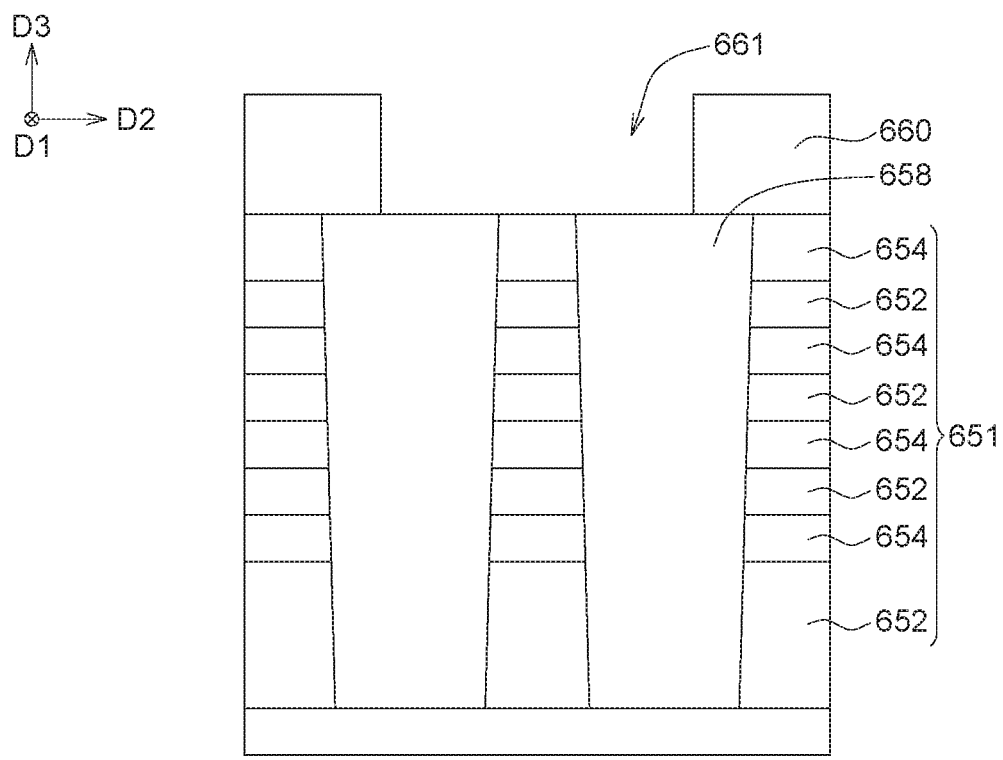
Figure 6B:
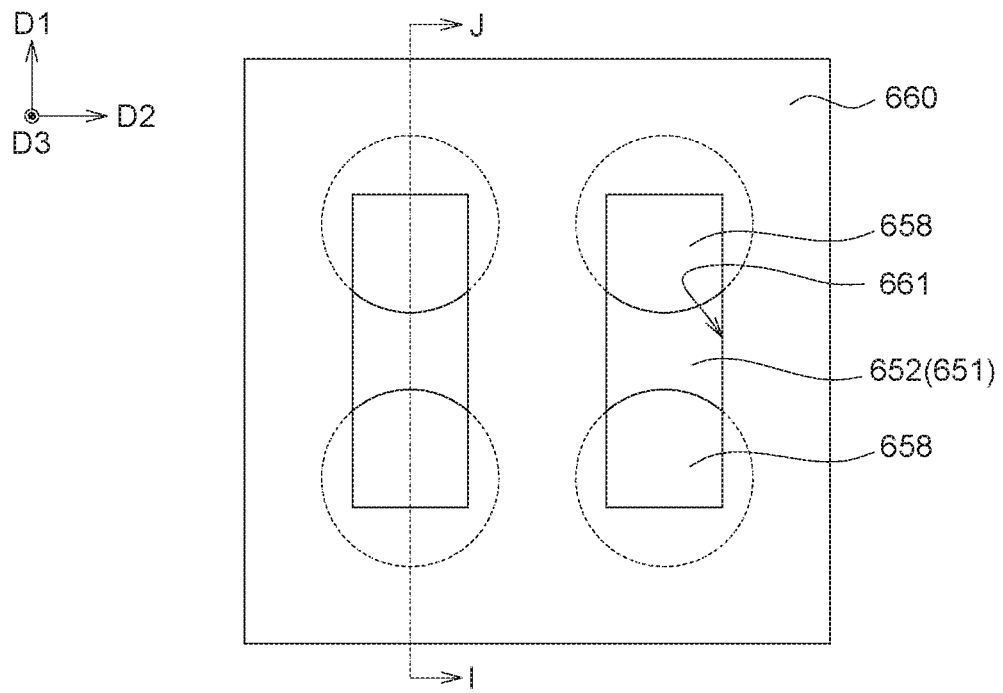
Figure 7A:
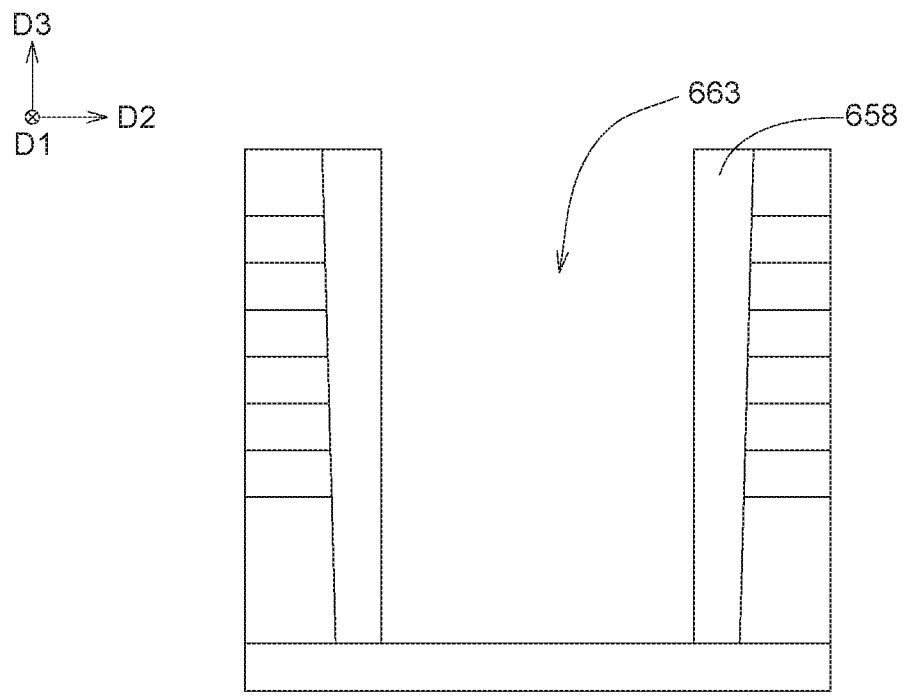
Figure 7B:
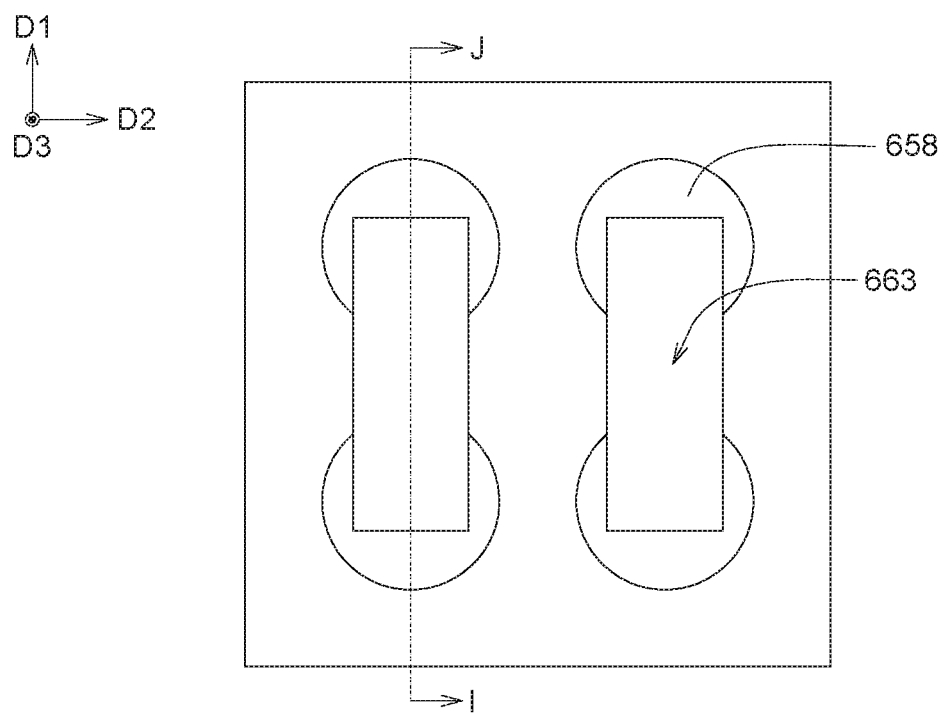
Figure 8A:
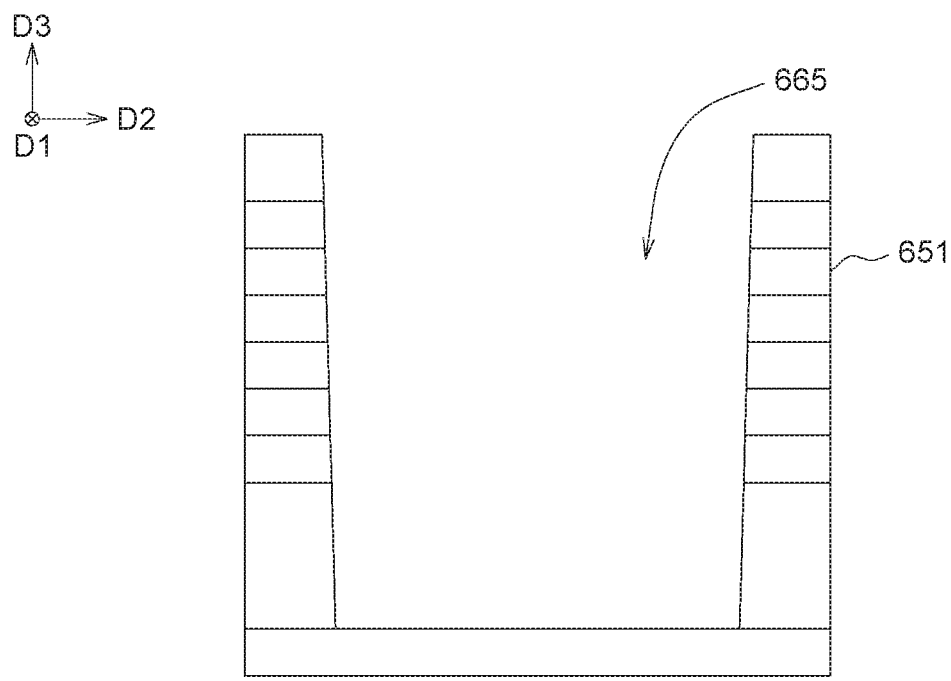
Figure 8B:
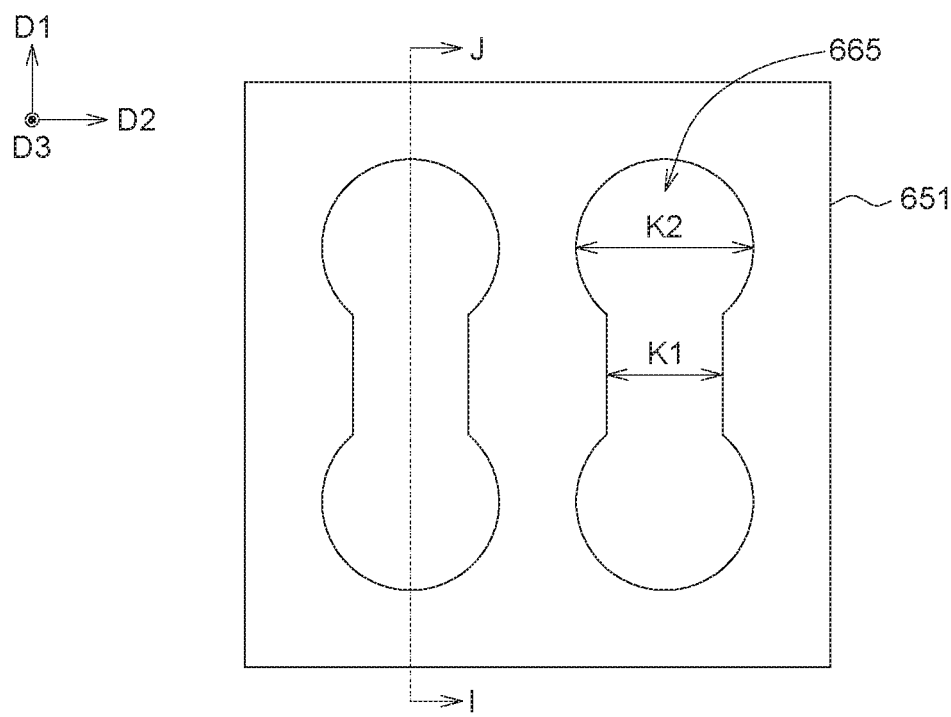

FIG. 6A and FIG. 6B are referred to. FIG. 6A is a longitudinal cross-section view of the memory device, which may be drawn along the I-J line shown in FIG. 6B. FIG. 6B is a top view of the memory device. A mask layer 660 may be formed on the stacked structure 651. The mask layer 660 may have a hole 661 exposing a portion of the material pillar 658 and a portion of the stacked structure 651 between the material pillars 658. The mask layer 660 may comprise a photoresist formed with using a photolithography process. Then, the portions of the material pillar 658 and the stacked structure 651 exposed by the hole 661 of the mask layer 660 may be removed by using an etching process so as to form trench 663 as shown in FIG. 7A and FIG. 7B. FIG. 7A is a longitudinal cross-section view of the memory device, which may be drawn along the I-J line shown in FIG. 7B. FIG. 7B is a top view of the memory device. Then, the mask layer 660 (FIG. 6A and FIG. 6B) may be removed. The material pillar 658 is removed to form a cavity 665 as shown in FIG. 8A and FIG. 8B. The cavity 665 in the stacked structure 651 may have a dumbbell shape. FIG. 8A is a longitudinal cross-section view of the memory device, which may be drawn along the I-J line shown in FIG. 8B. FIG. 8B is a top view of the memory device.

Figure 9A:
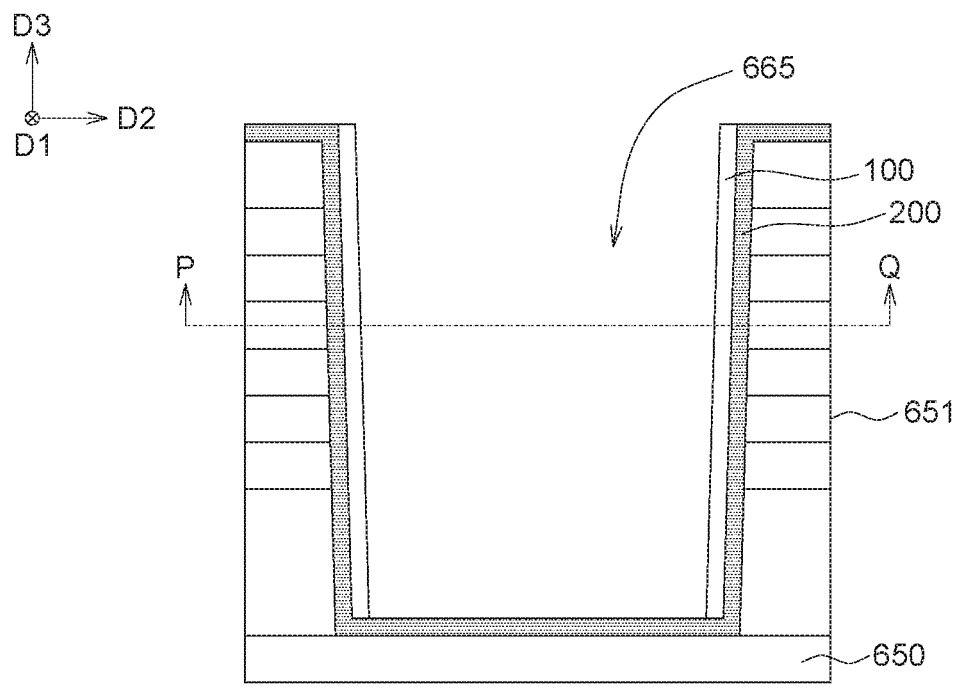
Figure 9B:
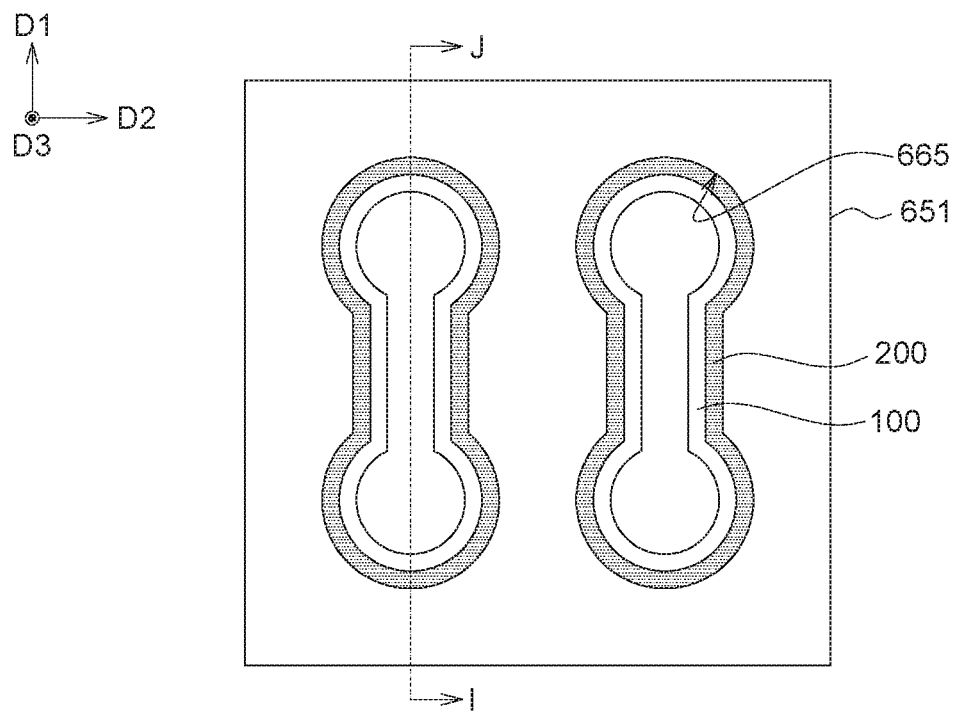

FIG. 9A and FIG. 9B are referred to. FIG. 9A is a longitudinal cross-section view of the memory device, which may be drawn along the I-J line shown in FIG. 9B. FIG. 9B is a lateral cross-section view of the memory device, which may be drawn along a P-Q line shown in FIG. 9A. The memory element 200 may be formed on a sidewall surface of the stacked structure 651 and an upper surface of the substrate 650 exposed by the cavity 665, and on an upper surface of the stacked structure 651. The memory element 200 may comprise any kind of charge trapping structure, such as an ONO structure, or BE-SONOS structure, etc. For example, a charge trapping layer may use a nitride such as silicon nitride, or other high-K materials comprising a metal oxide such as $Al_2O_3$, $HfO_2$, and so on. The channel element 100 may be formed on a sidewall surface of the memory element 200 exposed by the cavity 665. In an embodiment, the channel element 100 as shown in FIG. 9A and FIG. 9B may be formed by a method comprising forming a channel material on an all exposed surface of the memory element 200, and then removing a portion of the channel material on the bottom of the cavity 665 and on the upper surface of the stacked structure 651 with using anisotropic etching or etching back method. The channel material on the sidewall surface of the memory element 200 remained from the etching step forms the channel element 100. In an embodiment, the channel material comprises polysilicon formed by a deposition method such as CVD, PVD, etc. However, the present disclosure is not limited thereto.

Figure 10A:
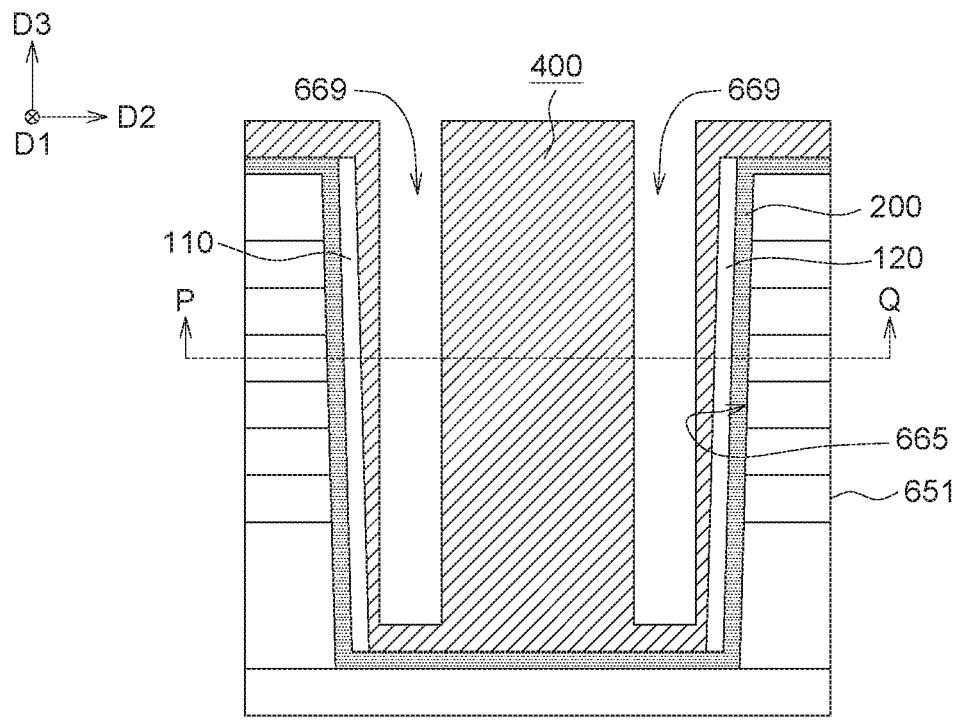
Figure 10B:
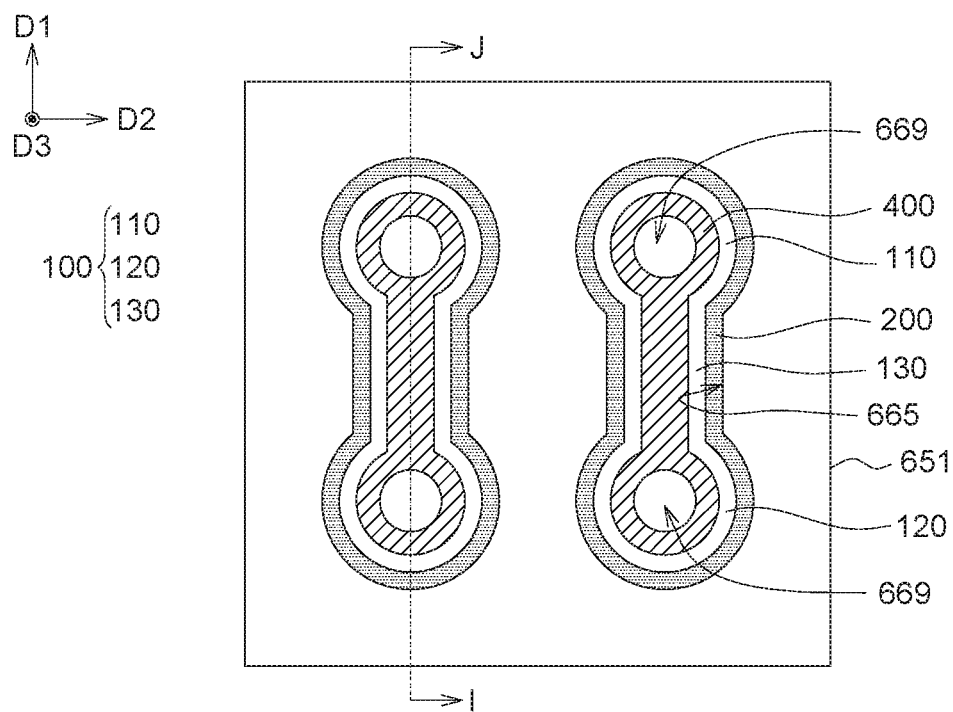
Figure 11A:
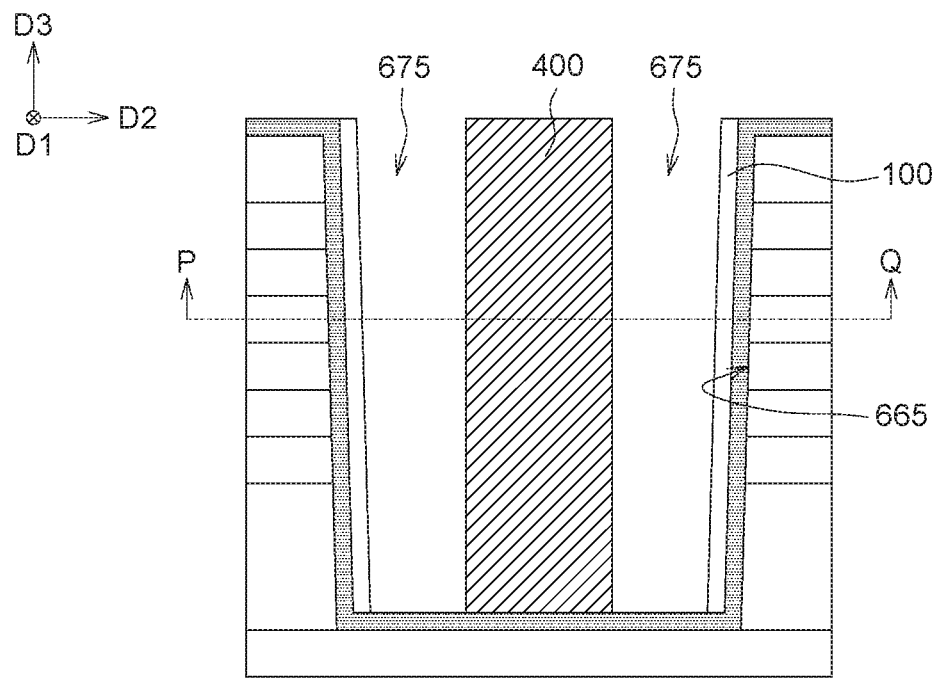
Figure 11B:
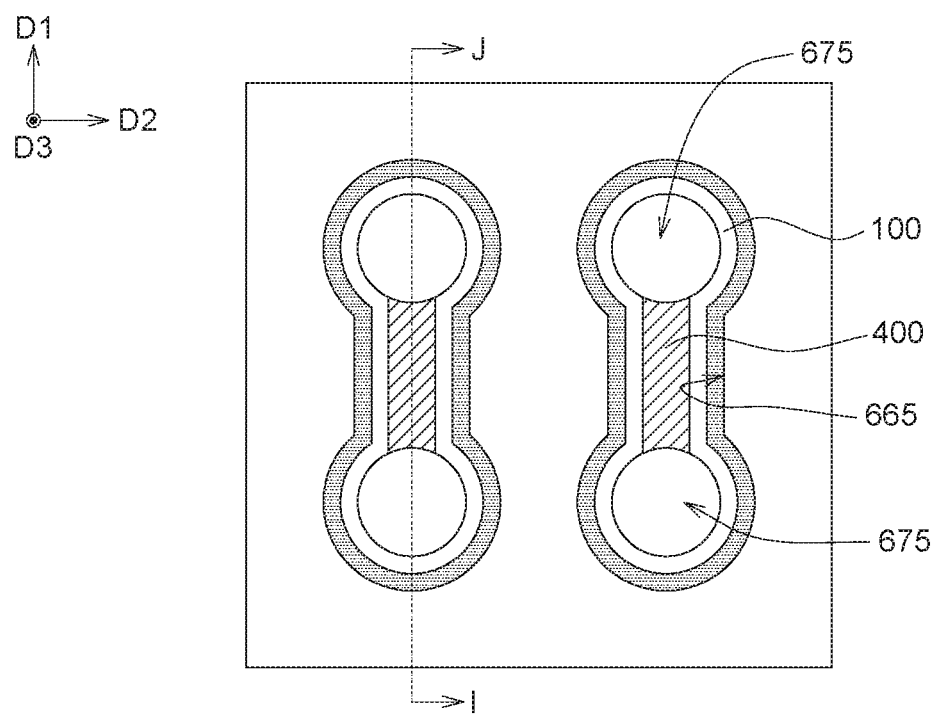

FIG. 10A and FIG. 10B are referred to. FIG. 10A is a longitudinal cross-section view of the memory device, which may be drawn along the I-J line shown in FIG. 10B. FIG. 10B is a lateral cross-section view of the memory device, which may be drawn along the P-Q line shown in FIG. 10A. The insulating element 400 may be formed on the sidewall surface of the channel element 100 and the upper surface of the memory element 200 exposed by the cavity 665, and on the memory element 200 on the upper surface of the stacked structure 651. The insulating element 400 may comprise an oxide such as silicon oxide formed by a CVD method, a PVD method, or other suitable deposition methods. However, the present disclosure is not limited thereto. In an embodiment, the deposition process for forming the insulating element 400 is proceeded until the insulating element 400 has a thickness at least fully filling a middle portion of the cavity 665. Two opposing end portions of the cavity 665 may be partially filled with the insulating element 400 to remain openings 669. An etching step such as an isotropic etching step may be performed to etch the insulating element 400 from the surface of which exposed by the opening 669 until the inner sidewall channel surfaces of the first channel portion 110 and the second channel portion 120 of the channel element 100 are exposed so as to form openings 675 as shown in FIG. 11A and FIG. 11B. The etching step may remain the insulating element 400 in the middle portion of the cavity 665. FIG. 11A is a longitudinal cross-section view of the memory device, which may be drawn along the I-J line shown in FIG. 11B. FIG. 11B is a lateral cross-section view of the memory device, which may be drawn along the P-Q line shown in FIG. 11A.

Figure 12A:
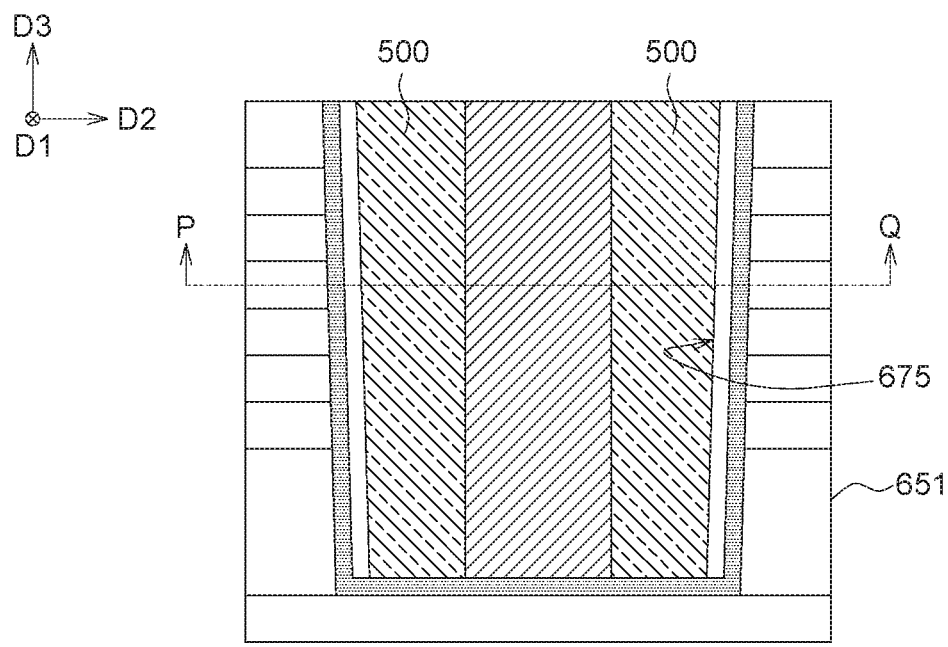
Figure 12B:
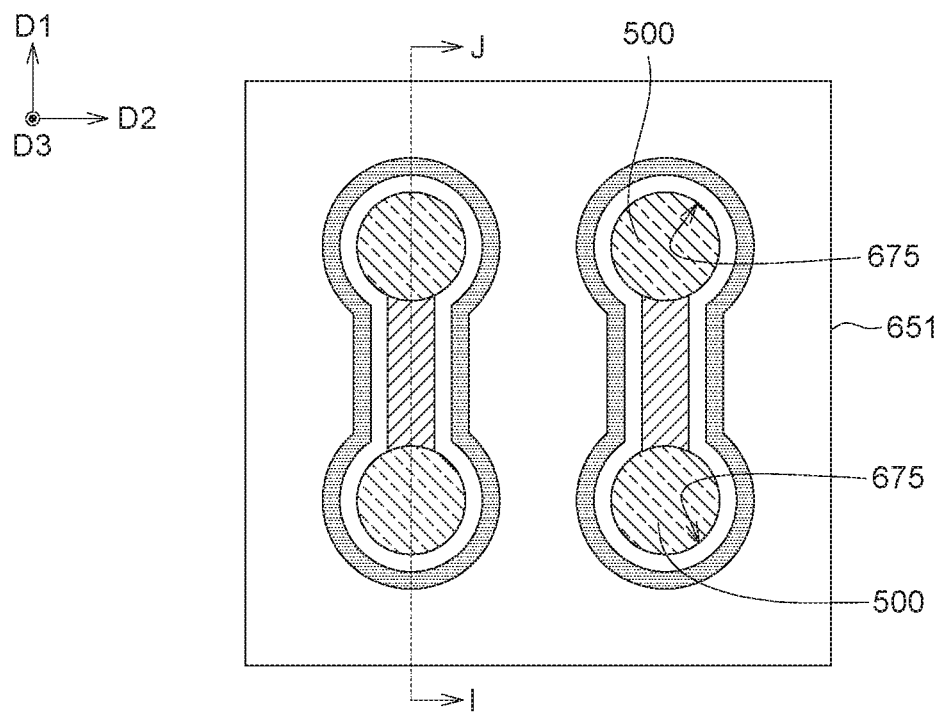

FIG. 12A and FIG. 12B are referred to. FIG. 12A is a longitudinal cross-section view of the memory device, which may be drawn along the I-J line shown in FIG. 12B. FIG. 12B is a lateral cross-section view of the memory device, which may be drawn along the P-Q line shown in FIG. 12A. The opening 675 may be filled with the pillar element 500. In an embodiment, the pillar element 500 may comprise a conductor material or a semiconductor material such as polysilicon, etc. Then, the material on the upper surface of the stacked structure 651 may be removed by an etching back method.

Figure 13A:
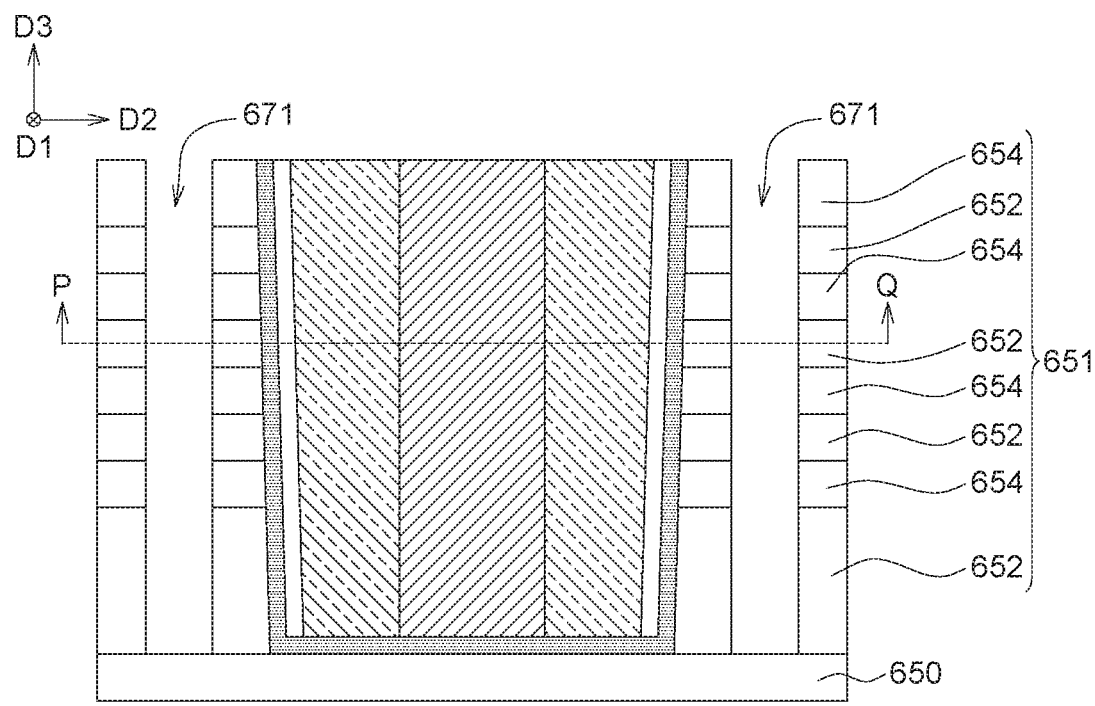
Figure 13B:
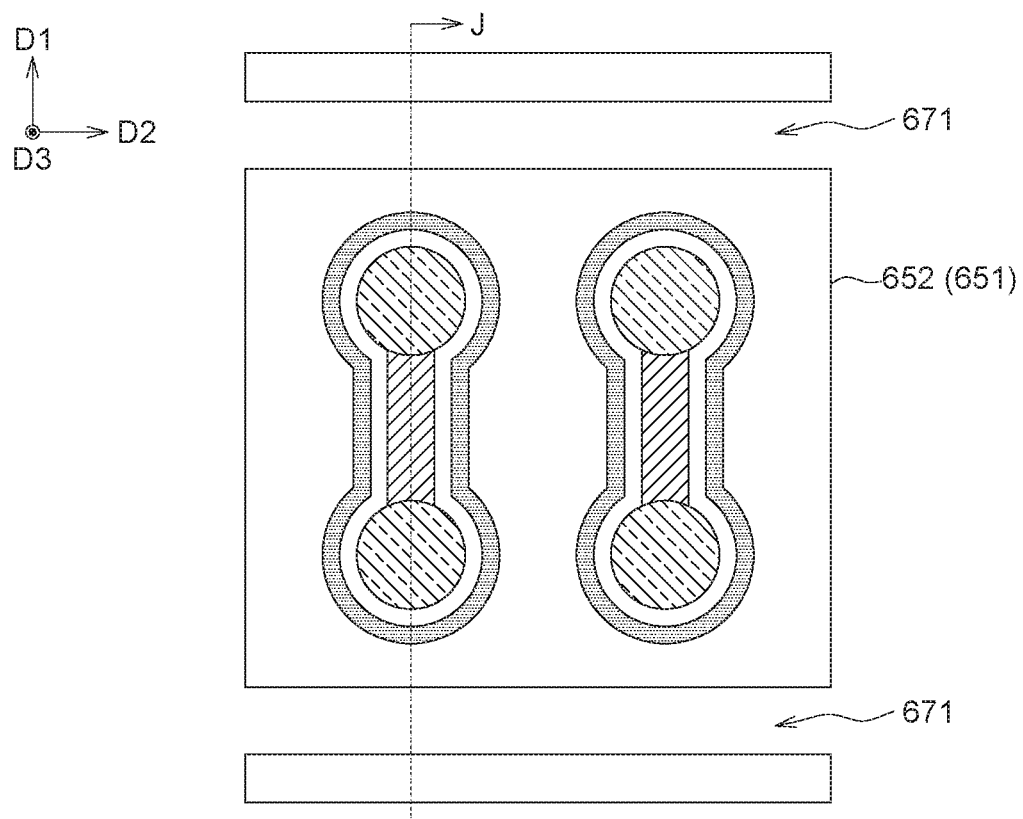

FIG. 13A and FIG. 13B are referred to. FIG. 13A is a longitudinal cross-section view of the memory device, which may be drawn along the I-J line shown in FIG. 13B. FIG. 13B is a lateral cross-section view of the memory device, which may be drawn along the P-Q line shown in FIG. 13A. A trench 671 may be formed in the stacked structure 651 by using a photolithography etching process. The sidewall surfaces of the insulating layer 654 and the material layer 652 of the stacked structure 651, and the upper surface of the substrate 650 may be exposed by the trench 671. The material layer 652 (i.e. as a sacrificial layer) exposed by the trench 671 may be removed by an etching step to form a slit 673 as shown in FIG. 14A and FIG. 14B.

Figure 14A:
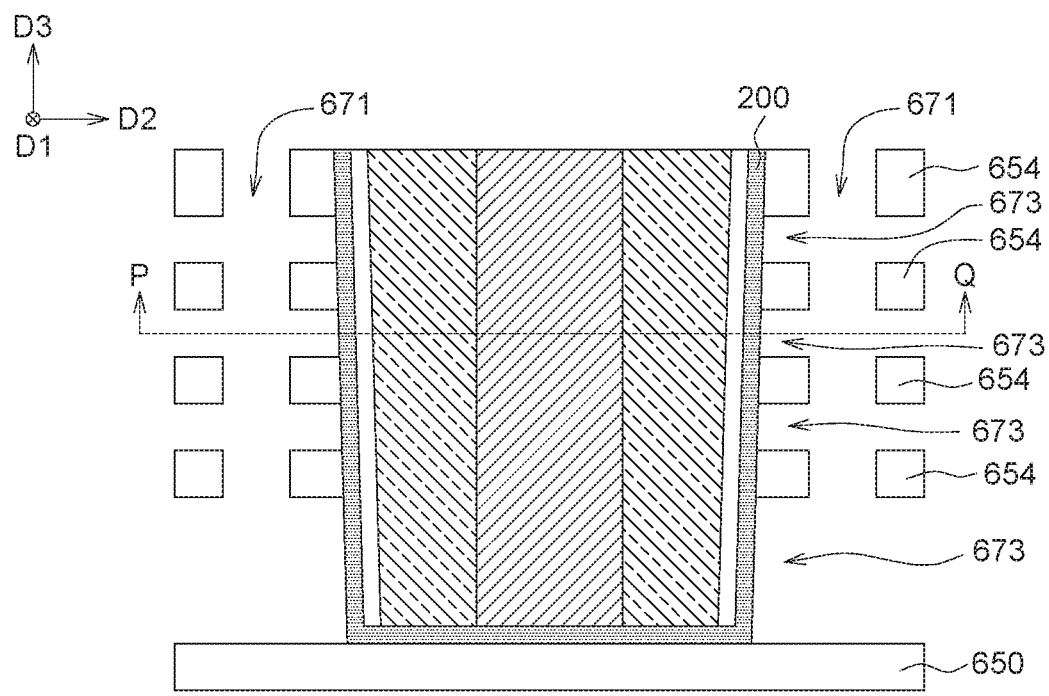
Figure 14B:
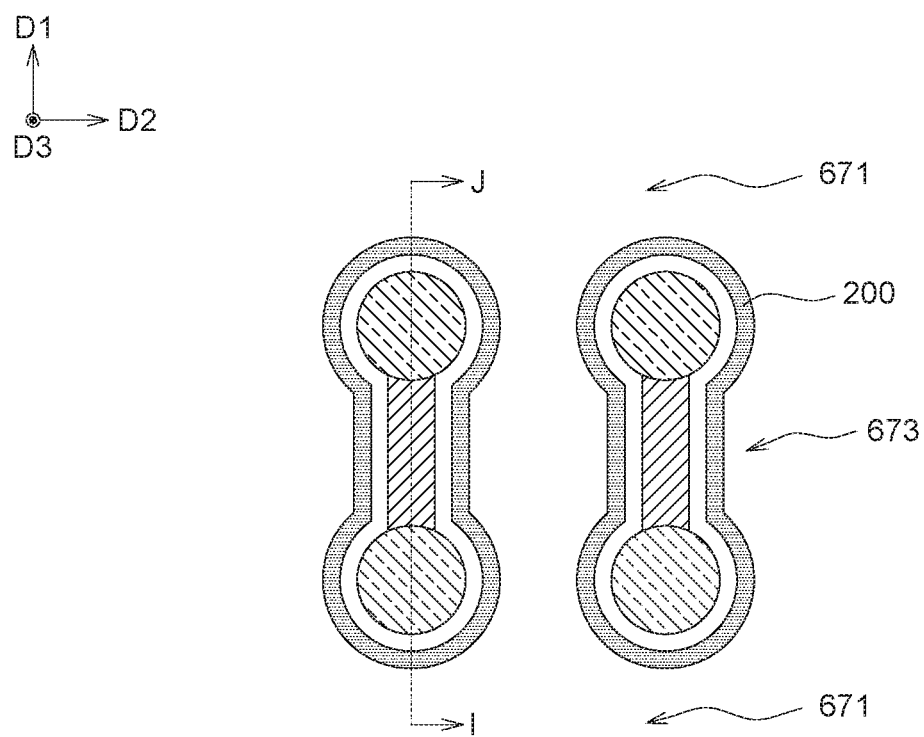

FIG. 14A and FIG. 14B are referred to. FIG. 14A is a longitudinal cross-section view of the memory device, which may be drawn along the I-J line shown in FIG. 14B. FIG. 14B is a lateral cross-section view of the memory device, which may be drawn along the P-Q line shown in FIG. 14A. The slit 673 may expose the outer sidewall surface of the memory element 200, an upper surface/lower surface of the insulating layer 654, and the upper surface of the substrate 650.

Figure 15A:
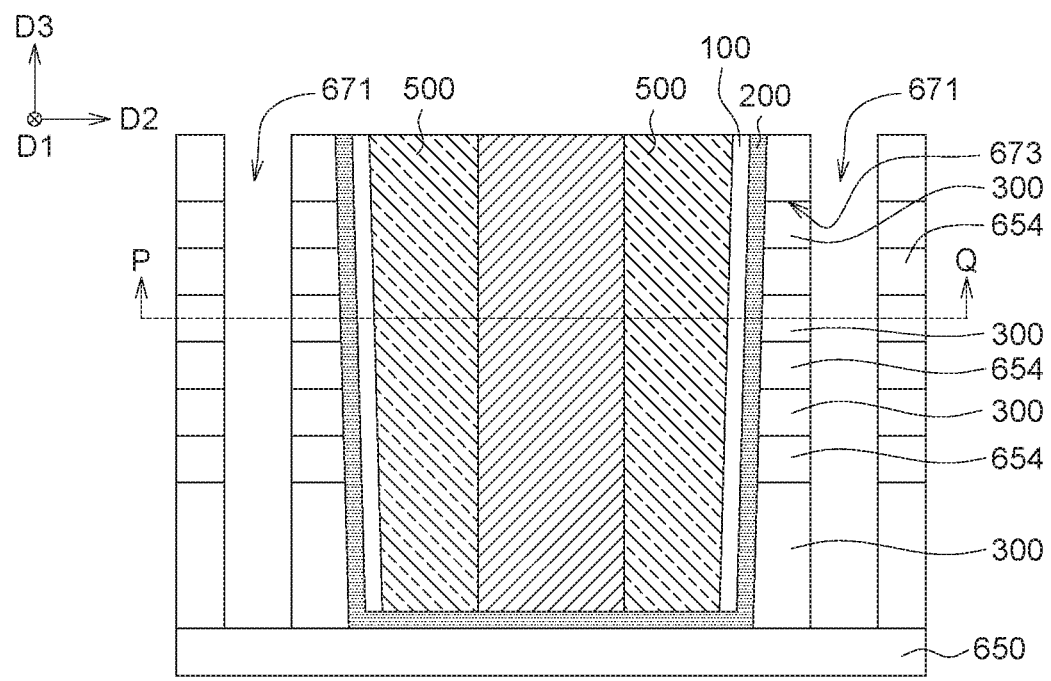
Figure 15B:
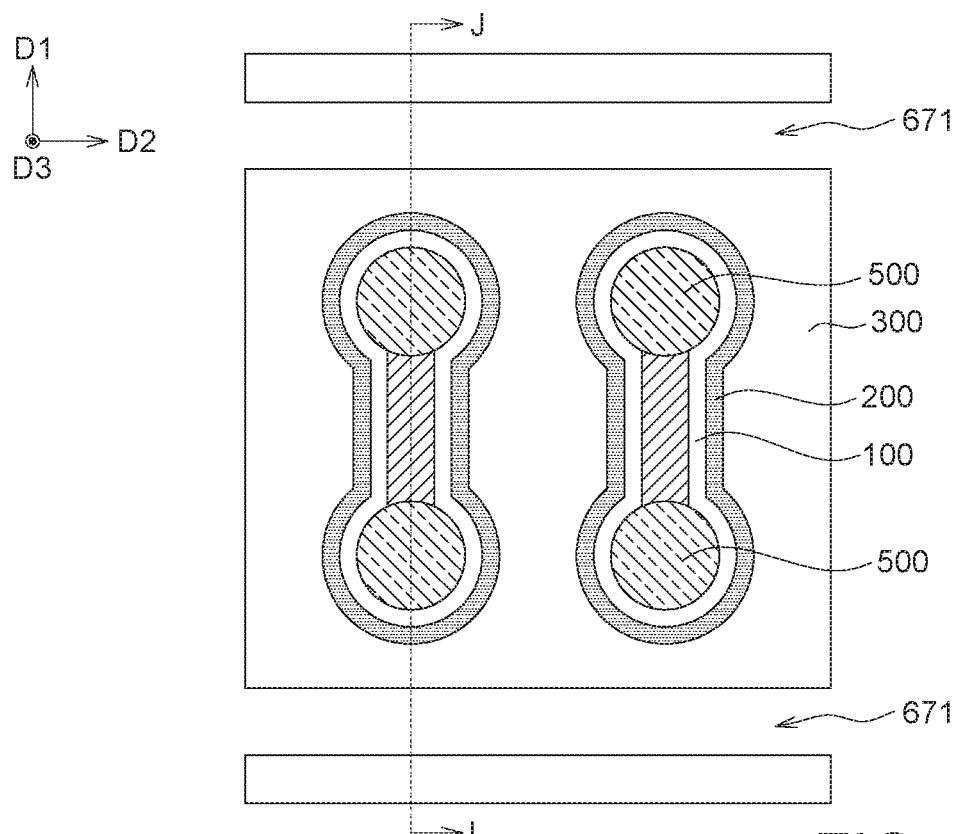

FIG. 15A and FIG. 15B are referred to. FIG. 15A is a longitudinal cross-section view of the memory device, which may be drawn along the I-J line shown in FIG. 15B. FIG. 15B is a lateral cross-section view of the memory device, which may be drawn along the P-Q line shown in FIG. 15A. The electrode element 300 may be formed in the slit 673. The electrode element 300 may comprise a metal layer, for example comprising tungsten (W) and so on. The electrode element 300 may also comprise a conductive barrier layer formed on the metal layer. For example, the barrier layer may comprise TaN, TiN and so on. In an embodiment, a dielectric film may be formed, and then the electrode element 300 may be formed on the dielectric film. The dielectric film may comprise a high-K material such as $Al_2O_3$, $HfO_2$, and so on, or other suitable dielectric materials. The electrode elements 300 are disposed on the sidewall surface of the memory element 200, and separated from each other by the insulating layers 654 along a third direction D3. The third direction D3 is different from the first direction D1 and the second direction D2. In an embodiment, the third direction D3 may be substantially perpendicular to the first direction D1 and the second direction D2. The third direction D3 may be the Z direction, such as a direction vertical to the upper surface of the substrate 650.

In embodiments, the material of the pillar element 500 may be identical to the material of the channel element 100, and a structure having which of a memory cell may be similar to the structure as shown in FIG. 2, wherein the pillar element 500 may be functioned as a component for the channel element 100. In another embodiment, the material of the pillar element 500 may be different from the material of the channel element 100, and a structure having which may be similar to the structure as shown in FIG. 3.

In embodiments, the electrode elements 300 are gate electrode elements. The electrode elements 300 can be functioned as word lines. The memory cells are defined in the memory element 200 between the channel element 100 and the electrode elements 300. The memory cells of different levels in the third direction D3 are electrically connected in parallel between the first channel portion 110 and the second channel portion 120 of the channel element 100. The memory device may comprise an AND-type memory device. The memory deceive may be formed with a self-aligning technique in manufacturing method according to embodiments. The manufacturing method is simple, and cost can be reduced.

Figure 16A:
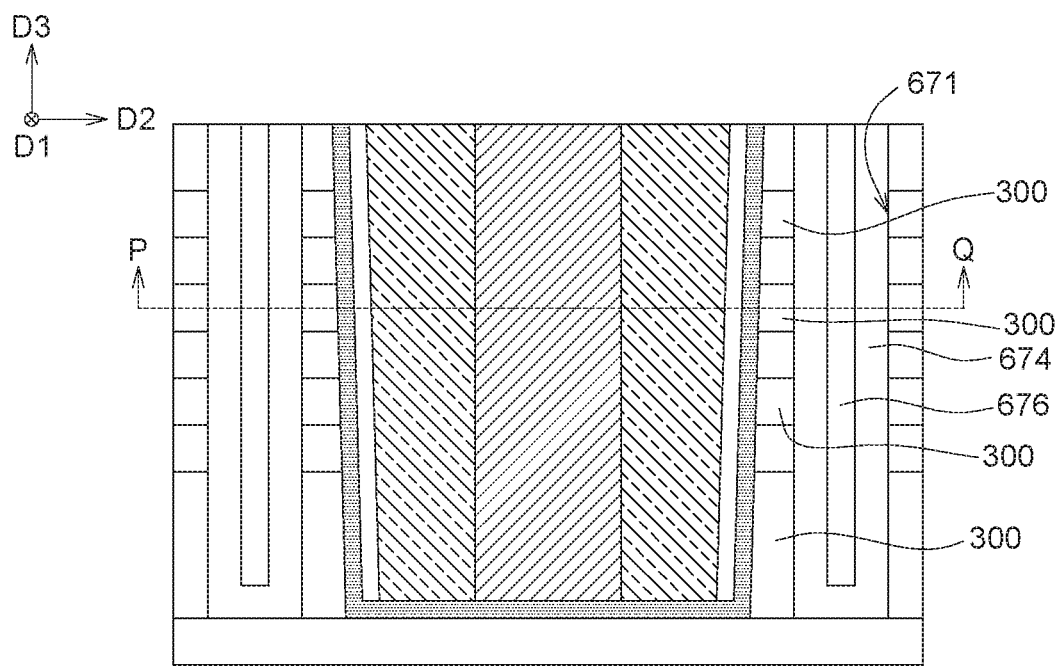
Figure 16B:
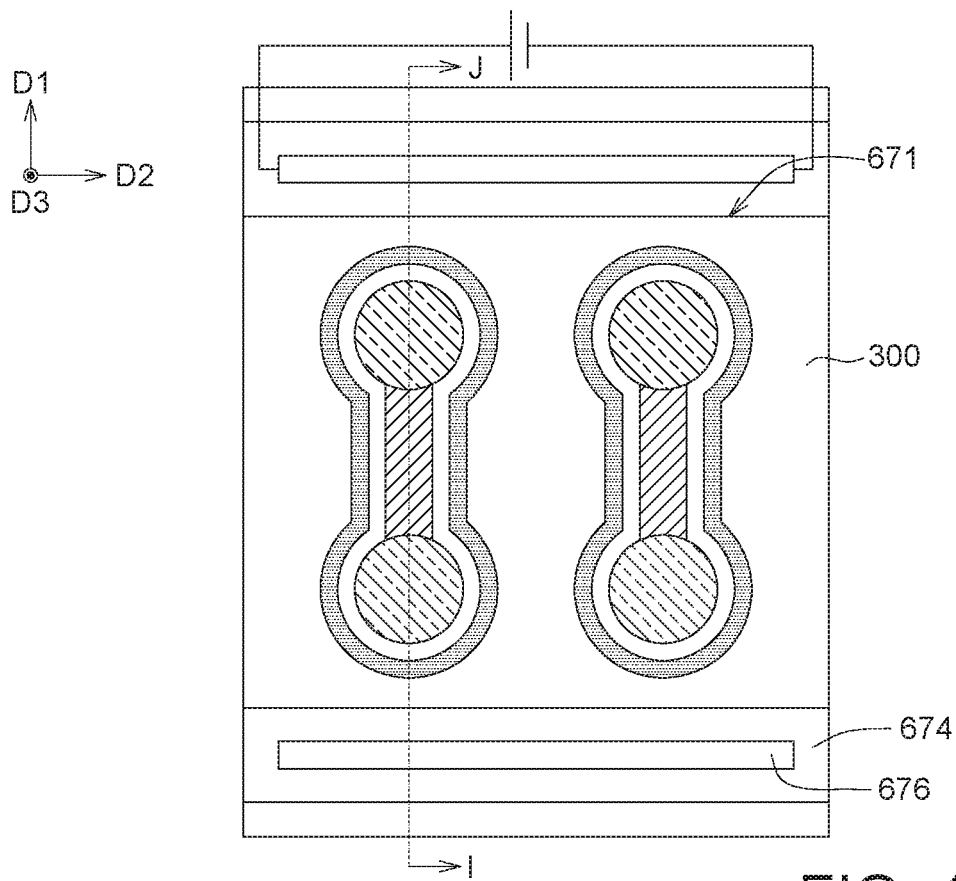

FIG. 16A and FIG. 16B are referred to. FIG. 16A is a longitudinal cross-section view of the memory device, which may be drawn along the I-J line shown in FIG. 16B. FIG. 16B is a lateral cross-section view of the memory device, which may be drawn along the P-Q line shown in FIG. 16A. An insulating film 674 may be formed in the trench 671. The insulating film 674 may comprise an oxide such as silicon oxide, or a nitride such as silicon nitride, or other suitable insulating materials. The insulating film 674 may be formed by a PVD method, a CVD method, or other suitable deposition methods. A material element 676 may be formed on the insulating film 674, and filling the trench 671. In an embodiment, the material element 676 is a conductive element, which may be electrically insulated from the electrode element 300 in the stacked structure by the insulating film 674. In this case, a voltage bias may be applied to the material element 676 to inject a current so as to perform a joule heating to the memory cell. By which, performance such as endurance and data retention of the memory cell may be improved. In another embodiment, the material element 676 is an insulating material, for example comprising an oxide such as silicon oxide, etc., and can be functioned as a bypass element together with the insulating film 674.

FIG. 17A and FIG. 17B are referred to. FIG. 17A is a longitudinal cross-section view of the memory device, which may be drawn along the I-J line shown in FIG. 17B. FIG. 17B is a top view of the memory device. The first conductive via 678 may be formed on the pillar element 500. A first metal layer M1 may be formed on the first conductive via 678. A second conductive via 680 may be formed on the first metal layer M1. A second metal layer M2 may be formed on the second conductive via 680. In an embodiment, the first channel portion 110 is electrically connected to the source, and the second channel portion 120 is electrically connected to the drain.

Figure 18:
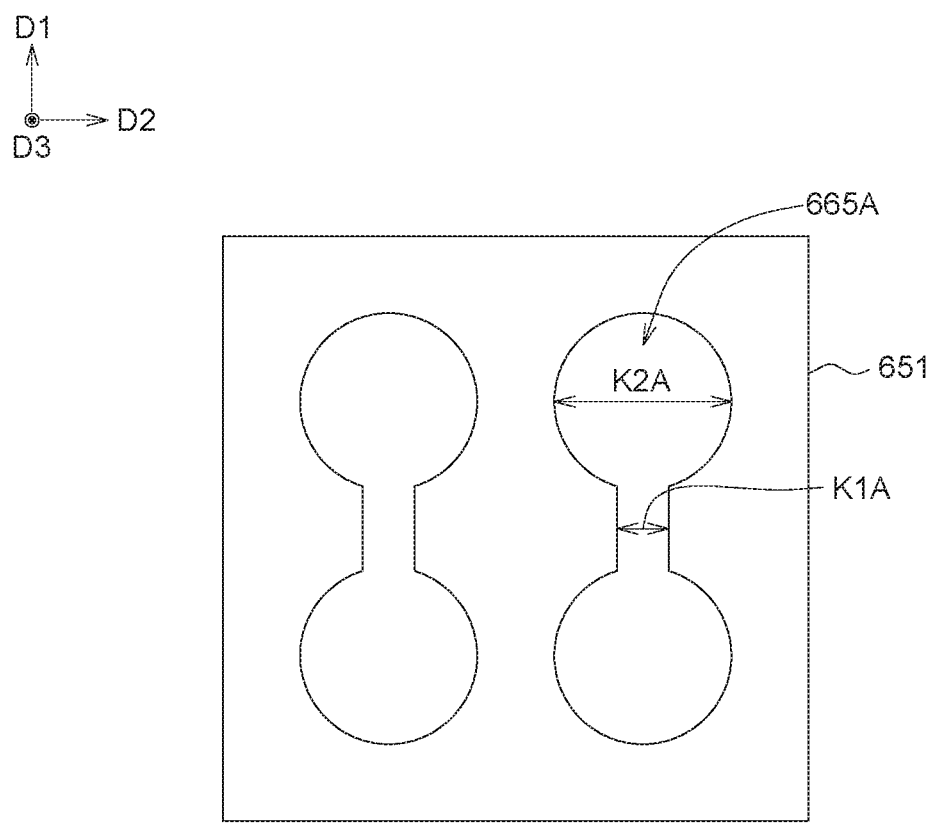
FIG. 18 illustrates a lateral cross-section view of a memory device according to embodiments.

In another embodiment, the structure shown in FIG. 18 may be formed with similar manufacturing step concepts described referring to FIG. 5A to FIG. 8B. The difference of the memory device in FIG. 18 and the memory device in FIG. 8B is described as the following. In this embodiment, the middle portion of the cavity 665A formed in the stacked structure 651 has a decreased size KIA (such as a width) in the second direction D2. For example, a ratio of the size KIA to a size K2A (i.e. K1A/K2A) in FIG. 18 is smaller than a ratio of a size K1 to a size K2 (i.e. K1/K2) of the cavity 665 in FIG. 8B. The size K2A may be the maximum size (such as a diameter) of the end portion of the cavity 665A in the second direction D2.

Figure 19A:
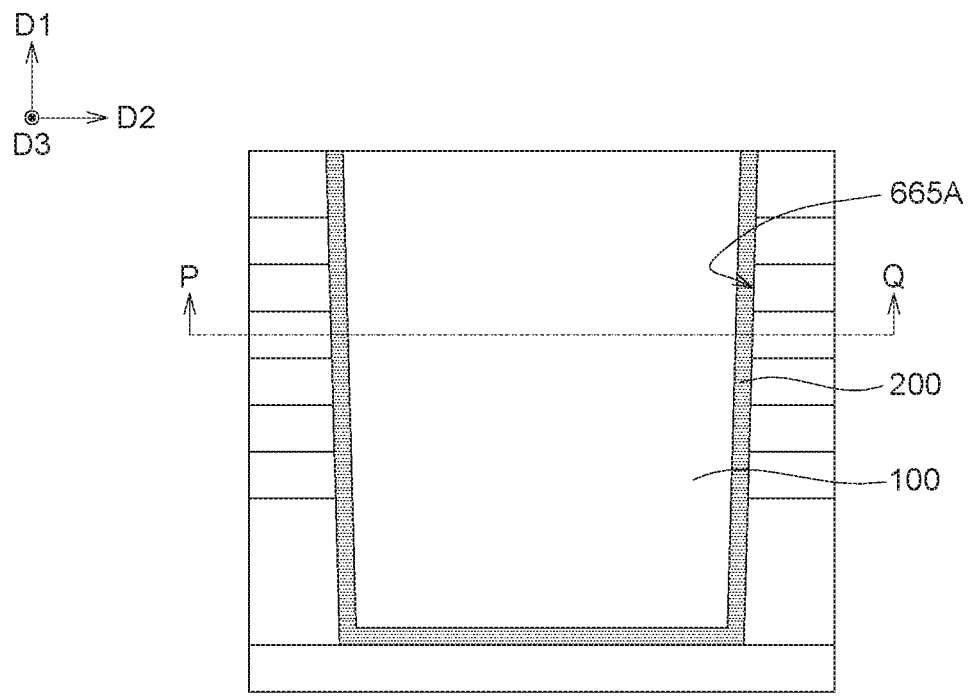
FIG. 19A illustrates a longitudinal cross-section view of a memory device according to embodiments.
Figure 19B:
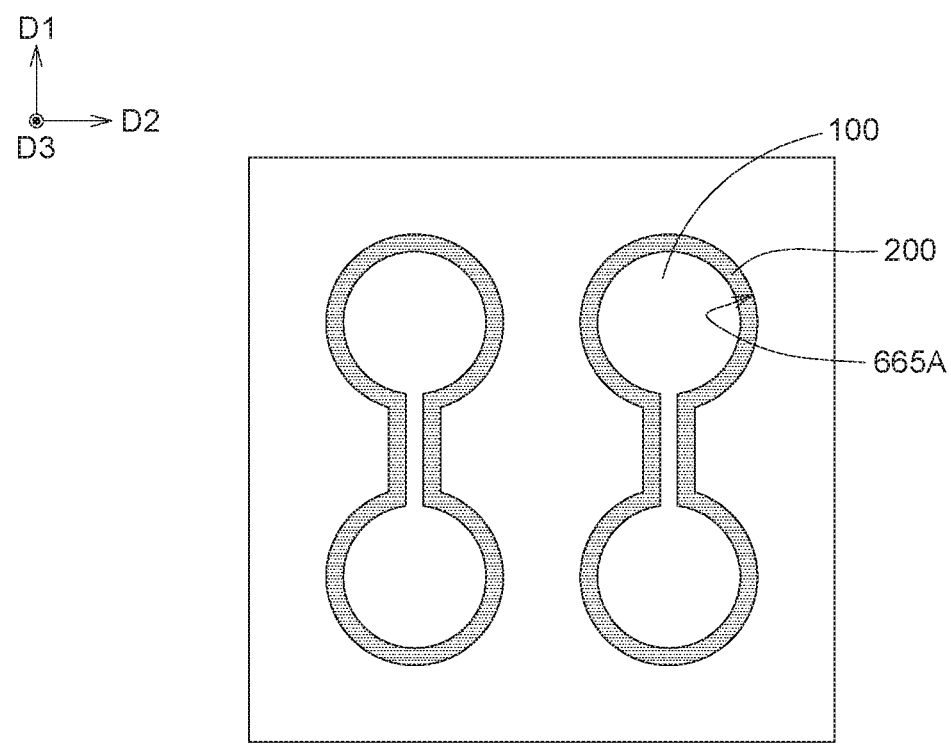
FIG. 19B illustrates a lateral cross-section view of a memory device according to embodiments.

In an embodiment, the structure shown in FIG. 19A and FIG. 19B may be formed by forming the memory element 200 and the channel element 100 in the cavity 665A shown in FIG. 18. FIG. 19A is a longitudinal cross-section view of the memory device, which may be drawn along the I-J line shown in FIG. 19B. FIG. 19B is a lateral cross-section view of the memory device, which may be drawn along the P-Q line shown in FIG. 19A. The difference of the memory device shown in FIG. 19A and FIG. 19B and the memory device shown in FIG. 9A and FIG. 9B is described as the following. The middle portion of the cavity 665A is fully filled with the memory element 200 and the channel element 100. Therefore, the steps relating to forming the insulating element 400 described with referring FIG. 10A to FIG. 12B may be omitted. In an embodiment, the structure shown in FIG. 19A and FIG. 19B may proceed the similar manufacturing steps described with referring to FIG. 13A to FIG. 17B so as to form the structure for a memory cell as shown in FIG. 1.

In another embodiment, the channel element 100 may be formed by using a CVD method, a PVD method, or other suitable deposition methods to fully fill the middle portion of the cavity 665A, and partially fill the two opposing end portions of the cavity 665A to remain openings (such as openings 681 in FIG. 4). Then, the openings may be filled with the pillar element 500. Then, the structure may proceed the similar manufacturing steps described with referring to FIG. 13A to FIG. 17B so as to form the structure for a memory cell as shown in FIG. 4.

According to the foregoing disclosure, the memory device of embodiments can have an increased memory cell array density.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
a channel element comprising a first channel portion, a second channel portion, and a middle channel portion between the first channel portion and the second channel portion, wherein the first channel portion has a first sidewall channel surface and a second sidewall channel surface opposing to the first sidewall channel surface, the middle channel portion has a third sidewall channel surface and a fourth sidewall channel surface opposing to the third sidewall channel surface, the first sidewall channel surface and the second sidewall channel surface of the first channel portion are outside the third sidewall channel surface and the fourth sidewall channel surface of the middle channel portion respectively;
a memory element;
an electrode element, wherein a memory cell is defined in the memory element between the channel element and the electrode element;
a first pillar element functioning as one of a source and a drain, wherein the first channel portion of the channel element surrounds at least a part of a sidewall surface of the first pillar element and the first pillar element extends along an entire depth of the first channel portion; and
a second pillar element functioning as the other of the source and the drain, wherein the second channel portion of the channel element surrounds at least a part of a sidewall surface of the second pillar element.

2. The memory device according to claim 1, wherein the middle channel portion comprises a first middle channel portion and a second middle channel portion separated from the first middle channel portion, the first middle channel portion and the second middle channel portion are between the first channel portion and the second channel portion.

3. The memory device according to claim 2, further comprising an insulating element, wherein the first middle channel portion and the second middle channel portion are separated from each other by the insulating element.

4. The memory device according to claim 1, wherein the first pillar element and the second pillar element comprise a channel material or an electrode material.

5. The memory device according to claim 1, wherein the first sidewall channel surface and the third sidewall channel surface are on the same one side of the channel element, the second sidewall channel surface and the fourth sidewall channel surface are on the same another side of the channel element.

6. The memory device according to claim 1, wherein the second channel portion has a fifth sidewall channel surface and a sixth sidewall channel surface opposing to the fifth sidewall channel surface, the fifth sidewall channel surface and the sixth sidewall channel surface of the second channel portion are outside the third sidewall channel surface and the fourth sidewall channel surface of the middle channel portion respectively.

7. The memory device according to claim 6, wherein the first sidewall channel surface, the third sidewall channel surface and the fifth sidewall channel surface are on the same one side of the channel element, the second sidewall channel surface, the fourth sidewall channel surface and the sixth sidewall channel surface are on the same another side of the channel element.

8. The memory device according to claim 1, wherein the first channel portion has a sidewall surface having an open ring shape, the third sidewall channel surface and the fourth sidewall channel surface of the middle channel portion have a plane shape.

9. The memory device according to claim 8, wherein the second channel portion has a sidewall surface having an open ring shape.

10. The memory device according to claim 1, wherein the first channel portion is electrically connected to one of a source electrode and a drain electrode, the second channel portion is electrically connected to the other of the source electrode and the drain electrode.

11. The memory device according to claim 1, wherein the channel element has a dumbbell shape arrangement.

12. The memory device according to claim 1, comprising a plurality of the electrode elements disposed on a sidewall surface of the memory element along a vertical direction and separated from each other, wherein a plurality of the memory cells is defined in the memory element between the channel element and the plurality of the electrode elements.

13. A memory device, comprising:
a channel element comprising a first channel portion, a second channel portion, and a middle channel portion between the first channel portion and the second channel portion;
a memory element comprising a first memory portion, a second memory portion, and a middle memory portion between the first memory portion and the second memory portion, wherein the first memory portion has a first outer sidewall memory surface and a second outer sidewall memory surface opposing to the first outer sidewall memory surface, the middle memory portion has a third outer sidewall memory surface and a fourth outer sidewall memory surface opposing to the third outer sidewall memory surface, the first outer sidewall memory surface and the second outer sidewall memory surface of the first memory portion are outside the third outer sidewall memory surface and the fourth outer sidewall memory surface of the middle memory portion respectively;
an electrode element, wherein a memory cell is defined in the memory element between the channel element and the electrode element;
a first pillar element functioning as one of a source and a drain, wherein the first channel portion of the channel element surrounds at least a part of a sidewall surface of the first pillar element and the first pillar elements extends along an entire depth of the first channel portion; and
a second pillar element functioning as the other of the source and the drain, wherein the second channel portion of the channel element surrounds at least a part of a sidewall surface of the second pillar element.

14. The memory device according to claim 13, wherein the first outer sidewall memory surface and the third outer sidewall memory surface are on the same one side of the memory element, the second outer sidewall memory surface and the fourth outer sidewall memory surface are on the same another side of the memory element.

15. The memory device according to claim 13, wherein the second memory portion has a fifth outer sidewall memory surface and a sixth outer sidewall memory surface opposing to the fifth outer sidewall memory surface, the fifth outer sidewall memory surface and the sixth outer sidewall memory surface of the second memory portion are outside the third outer sidewall memory surface and the fourth outer sidewall memory surface of the middle memory portion respectively.

16. The memory device according to claim 13, wherein the first memory portion and the second memory portion have open ring shapes opposing to each other, the middle memory portion has a straight strip shape.

17. The memory device according to claim 13, wherein an external of the memory element has a dumbbell shape.

18. A memory device, comprising: an insulating element having a straight strip shape;
   a channel element surrounding a sidewall surface of the insulating element, wherein the channel element comprises a first channel portion, a second channel portion, and a middle channel portion between the first channel portion and the second channel portion:
   a memory element;
   an electrode element, wherein a memory cell is defined in the memory element between the channel element and the electrode element;
   a first pillar element functioning as one of a source and a drain, wherein the first channel portion of the channel element surrounds at least a part of a sidewall surface of the first pillar element and the first pillar element extends along an entire depth of the first pillar element; and
   a second pillar element functioning as the other of the source and the drain, wherein the second channel portion of the channel element surrounds at least a part of a sidewall surface of the second pillar element.

19. The memory device according to claim 18, wherein the insulating element and the channel element as a whole have a dumbbell shape profile.

* * * * *